(12) United States Patent
Kikuchi

(10) Patent No.: US 7,822,143 B2
(45) Date of Patent: Oct. 26, 2010

(54) SYSTEMS AND METHOD FOR TRANSFERING DIGITAL DATA AND TRANSFERING PARALLEL DIGITAL DATA IN A SERIAL DATA STREAM INCLUDING CLOCK INFORMATION

(75) Inventor: Hidekazu Kikuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 692 days.

(21) Appl. No.: 10/981,288

(22) Filed: Nov. 4, 2004

(65) Prior Publication Data
US 2005/0147178 A1 Jul. 7, 2005

(30) Foreign Application Priority Data
Nov. 7, 2003 (JP) .............................. P2003-377741

(51) Int. Cl.
H04L 25/49 (2006.01)
H04B 1/38 (2006.01)

(52) U.S. Cl. ....................................... 375/288; 375/222

(58) Field of Classification Search ................ 375/288, 375/222, 286
See application file for complete search history.

(56) References Cited

U.S. PATENT DOCUMENTS

| | | | | |
|---|---|---|---|---|
| 4,686,528 A | * | 8/1987 | Ferrer et al. | 340/7.54 |
| 4,876,695 A | * | 10/1989 | Witters et al. | 375/211 |
| 5,828,326 A | | 10/1998 | Kikuchi | |
| 5,949,764 A | * | 9/1999 | Yoshida et al. | 370/263 |
| 6,266,383 B1 | | 7/2001 | Kikuchi | |
| 6,628,214 B1 | * | 9/2003 | Kawase et al. | 341/100 |
| 7,301,996 B1 | * | 11/2007 | Chi et al. | 375/226 |
| 2003/0080891 A1 | * | 5/2003 | Nagano | 341/155 |
| 2003/0087634 A1 | * | 5/2003 | Raghavan et al. | 455/423 |
| 2003/0217301 A1 | * | 11/2003 | Levy et al. | 713/400 |
| 2004/0104775 A1 | * | 6/2004 | Seremeta | 330/310 |
| 2004/0109506 A1 | * | 6/2004 | Hinton et al. | 375/242 |
| 2005/0047430 A1 | * | 3/2005 | Moat et al. | 370/450 |

FOREIGN PATENT DOCUMENTS

| | | |
|---|---|---|
| JP | 09-168147 | 6/1997 |
| JP | 11-098130 | 4/1999 |
| JP | 2000-244586 | 9/2000 |
| JP | 2003-217064 | 7/2003 |

* cited by examiner

Primary Examiner—David C Payne
Assistant Examiner—Brian J Stevens
(74) Attorney, Agent, or Firm—Robert J. Depke; Rockey, Depke & Lyons, LLC

(57) ABSTRACT

The present invention provides a data transfer system including a data transmitter and a data receiver. The data transmitter converts a plurality of bits of transmission parallel data into serial data and generates a multi-level logic signal representing a plurality of bits of information in one symbol, the information being obtained by combining the serial data with a word clock as one-bit information. The word clock indicates a word delimiter in the serial data. The data receiver receives the transmitted multi-level logic signal, extracts the serial data and the word clock from the signal, and reproduces the parallel data based on the extracted word clock. In the data transfer system, a multi-bit digital signal can be transmitted as one signal including a word clock. Thus, components and mounting space to be allocated to transfer can be reduced.

26 Claims, 17 Drawing Sheets

FIG. 5

| TRANSMISSION WORD CLOCK | TRANSMISSION SERIAL DATA S1 S0 | OUTPUT CURRENT OF DATA TRANSMITTER | RECEIVED VOLTAGE OF DATA RECEIVER | RECEIVED WORD CLOCK | RECEIVED SERIAL DATA S1 S0 |
|---|---|---|---|---|---|
| 1 | 1　1 | 7Io | 7IoRt | 1 | 1　1 |
| 1 | 1　0 | 6Io | 6IoRt | 1 | 1　0 |
| 1 | 0　1 | 5Io | 5IoRt | 1 | 0　1 |
| 1 | 0　0 | 4Io | 4IoRt | 1 | 0　0 |
| 0 | 1　1 | 3Io | 3IoRt | 0 | 1　1 |
| 0 | 1　0 | 2Io | 2IoRt | 0 | 1　0 |
| 0 | 0　1 | Io | IoRt | 0 | 0　1 |
| 0 | 0　0 | 0 | 0 | 0 | 0　0 |

FIG. 12

| TRANSMISSION SERIAL DATA | TRANSMISSION WORD CLOCK | CURRENT AT POS TERMINAL | CURRENT AT NEG TERMINAL | RECEIVED SERIAL DATA | RECEIVED WORD CLOCK |
|---|---|---|---|---|---|
| 1 | 1 | 0 | 3Io | 1 | 1 |
| 1 | 0 | Io | 2Io | 1 | 0 |
| 0 | 0 | 2Io | Io | 0 | 0 |
| 0 | 1 | 3Io | 0 | 0 | 1 |

SYSTEMS AND METHOD FOR TRANSFERING DIGITAL DATA AND TRANSFERING PARALLEL DIGITAL DATA IN A SERIAL DATA STREAM INCLUDING CLOCK INFORMATION

BACKGROUND OF THE INVENTION

1. Field of the Invention

The present invention relates a data transfer system and method, a data transmitter, a data receiver, a data transmission method, and a data reception method and, more particularly, to a data transfer system and method for multi-bit digital data transfer, a data transmitter, a data receiver, a data transmission method, and a data reception method for the same.

2. Description of the Related Art

Many industrial applications require multi-bit digital data transfer. In many cases, however, multipolar cables and connectors cannot be used because transmission distance or mounting area and volume are limited. Then, various multiplexing approaches are used.

As a typical example of conventional digital data transfer, digital data transfer to a high-definition color liquid crystal monitor of a computer or the like will now be described.

Digital Interface Standards for Monitor as JEIDA standards (http://it.jeita.or.jp/document/publica/standard/summary/Dis m-vlj.pdf) disclose the following techniques for the purpose of multiplexing multi-bit video data, including RGB signals and synchronization signals, for transmission over a transmission line having the small number of electrodes.

According to LVDS (Low Voltage Differential Signaling), seven bits of parallel data is multiplexed by parallel-to-serial conversion to produce a pair of differential signal components. Another pair of differential signal components is used separately from the above pair of signal components in order to transmit a clock signal of the parallel data. A data receiver multiplies the clock signal to generate a clock having a frequency that is seven times as high as that of the clock signal. The generated clock is used to capture serial data. Further, on the basis of the transmitted clock signal, the data receiver obtains timing at which the serial data is converted into parallel data.

According to the principle of LVDS, disadvantageously, even if data multiplexing is improved, at least two transmission lines are inevitably required to transmit data and a clock. Further, if the difference in time between the two transmission lines, namely, skew occurs, the timing of serial-to-parallel conversion in the data transmitter cannot be accurately obtained.

According to TMDS (Transition Minimized Differential Signaling) (trade mark of Silicon Image, Inc.), parallel data is encoded and is then transmitted. Thus, timing of serial-to-parallel conversion can be obtained from the code. Accordingly, the above disadvantage regarding skew is overcome. However, it is necessary to interrupt free data transmission at regular time intervals and transmit a special signal to obtain the timing. Disadvantageously, data cannot be freely transmitted at desired time. Additionally, similar to LVDS, at least two transmission lines are required.

According to GVIF (Giga-bit Video Interface) (trade mark of Sony Corp.), in the minimum configuration, all of image data is combined with a clock into a one-bit signal. Accordingly, a transmission line with the minimum configuration supports one pair of differential signal components. In this case, a separate clock line is not needed. Thus, there is no skew in transmitting data and the clock. Japanese Unexamined Patent Application Publication No. 9-168147 discloses a mechanism of combining a clock and a timing signal for serial-to-parallel conversion with a transmission code according to GVIF.

According to a conventional method disclosed in Japanese Unexamined Patent Application Publication No. 9-168147, a bit clock is extracted from the transition of transmission data and timing of serial-to-parallel conversion is obtained by detecting synchronization (sync) codes (vertical sync data and horizontal sync data). In clock data recovery in which data and a clock are extracted using transition time of transmission data as clock information, frequency misidentification easily occurs. A phenomenon called harmonic lock may occur. Due to harmonic lock, a clock with an abnormal frequency and meaningless data are extracted.

Preventing the above-mentioned harmonic lock requires complex auxiliary means disclosed in Japanese Unexamined Patent Application Publication No. 11-98130.

As mentioned above, in the conventional multi-bit digital data transmission, according to LVDS, at least two transmission lines are needed to transmit data and a clock. Disadvantageously, skew may occur. According to TMDS, it is necessary to interrupt free data transmission at regular time intervals and transmit a special signal in order to obtain timing of serial-to-parallel conversion. Unfortunately, data cannot be freely transmitted at desired time.

GVIF has a disadvantage in that harmonic lock may occur and complex auxiliary means for preventing harmonic lock is needed. According to GVIF, synchronization codes are transmitted infrequently. Unfortunately, if timing of serial-to-parallel conversion in the data transmitter is missed due to noise, it takes time to recover the timing.

SUMMARY OF THE INVENTION

The present invention is made in consideration of the above disadvantages. It is an object of the present invention to provide a data transfer system and method capable of reliably transferring data and clock information through one transmission line with a simple structure, a data transmitter, a data receiver, a data transmission method, and a data reception method for the same.

To overcome the above-mentioned disadvantages, the present invention provides a data transfer system for transferring a plurality of bits of data through a transmission line, the system including: a data transmitter for converting a plurality of bits of parallel data to be transferred into serial data and generating a multi-level logic signal representing a plurality of bits of information in one symbol to transmit the generated signal, the information being obtained by combining the serial data with a word clock as one-bit information, the word clock indicating a word delimiter in the serial data; and a data receiver for receiving the transmitted multi-level logic signal, extracting the serial data and the word clock from the multi-level logic signal, and reproducing the parallel data based on the extracted word clock.

According to the above structure, the data transmitter converts a plurality of bits of parallel data to be transferred into serial data and generates a multi-level logic signal representing a plurality of bits of information in one symbol to transmit the generated signal. The information is obtained by combining the serial data with a word clock as one-bit information. The word clock indicates a word delimiter in the serial data. The data receiver receives the transmitted multi-level logic signal, extracts the serial data and the word clock from the multi-level logic signal, and reproduces the parallel data based on the extracted word clock.

Further, the present invention provides a data transmitter for transmitting a plurality of bits of data through a transmission line, the data transmitter including: a parallel-to-serial conversion circuit for converting a plurality of bits of parallel data to be transferred into serial data; a frequency multiplication circuit for multiplying a data clock synchronized with the parallel data to generate a bit clock, which is required for the operation of the parallel-to-serial conversion circuit, and generating a word clock on the basis of the data clock, the word clock indicating a word delimiter in the serial data; and a multi-level logic signal generation circuit for generating a multi-level logic signal representing a plurality of bits of information in one symbol, the information being obtained by combining the word clock with the serial data.

According to the above structure, the parallel-to-serial conversion circuit converts a plurality of bits of parallel data to be transferred into serial data. The frequency multiplication circuit multiplies a data clock synchronized with the parallel data to generate a bit clock, which is required for the operation of the parallel-to-serial conversion circuit, and generates a word clock on the basis of the data clock, the word clock indicating a word delimiter in the serial data. The multi-level logic signal generation circuit generates a multi-level logic signal representing a plurality of bits of information in one symbol, the information being obtained by combining the word clock with the serial data.

Further, the present invention provides a data receiver for receiving a plurality of bits of data through a transmission line, the data receiver including: a comparator unit for comparing reference voltages with a received multi-level logic signal to extract serial data and a word clock, the multi-level logic signal representing a plurality of bits of information in one symbol, the information being obtained by combining the serial data with the word clock indicating a word delimiter in the serial data; a frequency multiplication circuit for multiplying the extracted word clock to generate a bit clock and generating a data clock based on the word clock, the data clock being synchronized with parallel data; and a serial-to-parallel conversion circuit for converting the extracted serial data into the parallel data in accordance with the bit clock and the data clock.

According to the above structure, the comparator unit compares reference voltages with a received multi-level logic signal to extract serial data and a word clock, the multi-level logic signal representing a plurality of bits of information in one symbol, the information being obtained by combining the serial data with the word clock indicating a word delimiter in the serial data. The frequency multiplication circuit multiplies the extracted word clock to generate a bit clock and generates a data clock based on the word clock, the data clock being synchronized with parallel data. The serial-to-parallel conversion circuit converts the extracted serial data into the parallel data in accordance with the bit clock and the data clock.

In the data transfer system according to the present invention, a multi-bit digital signal can be transmitted as one signal including a word clock. Thus, components and mounting space to be allocated to transfer can be reduced. Further, since a plurality of transmission lines are not needed, there is no difference in arrival time between transmission lines, i.e., no skew in principle. Thus, the transfer system does not require any device for compensating for skew.

Further, to combine a word clock as clock information with data into one signal, a multi-level logic signal is used. In the data receiver, therefore, the clock can be extracted and recovered by the comparator unit and the frequency multiplication circuit. The comparator unit and the frequency multiplication circuit operate more stably than a clock recovery PLL, which is required for a general clock multiplexing method of transmitting a clock such that the clock phase matches transition time of a transmission signal. Accordingly, the present system does not generate a phenomenon, called harmonic lock, in that a frequency different from that of the clock is extracted.

Regarding a word clock combined with data into a multi-level logic signal, the word clock indicates a word delimiter of serial data obtained by parallel-to-serial conversion. Therefore, it is unnecessary to perform complicated processing, e.g., temporarily interrupt data transfer and transmit a special signal indicative of the head of a word. Advantageously, the respective structures of the transmitter and the receiver can be simplified. Further, even when noise interferes with the operation of the serial-to-parallel conversion circuit in the receiver, the operation can be immediately recovered based on word clocks, which are always transferred, without waiting the transfer of the next special signal.

The present invention can be applied to digital image information transfer to high-definition color liquid crystal monitors, e.g., a computer, a portable terminal, and an on-vehicle information display, and further, to high speed multi-bit information transmission between a main unit and a movable unit such as a scanner head or a printer head.

BRIEF DESCRIPTION OF THE DRAWINGS

FIG. 5 is a table showing the correspondence of multi-level logic and transfer data;

FIG. 12 is a table showing the correspondence of four-level logic and transfer data;

DESCRIPTION OF THE PREFERRED EMBODIMENTS

First Embodiment

A data transfer system according to a first embodiment of the present invention will now be described in detail with reference to the drawings.

Figure 1:
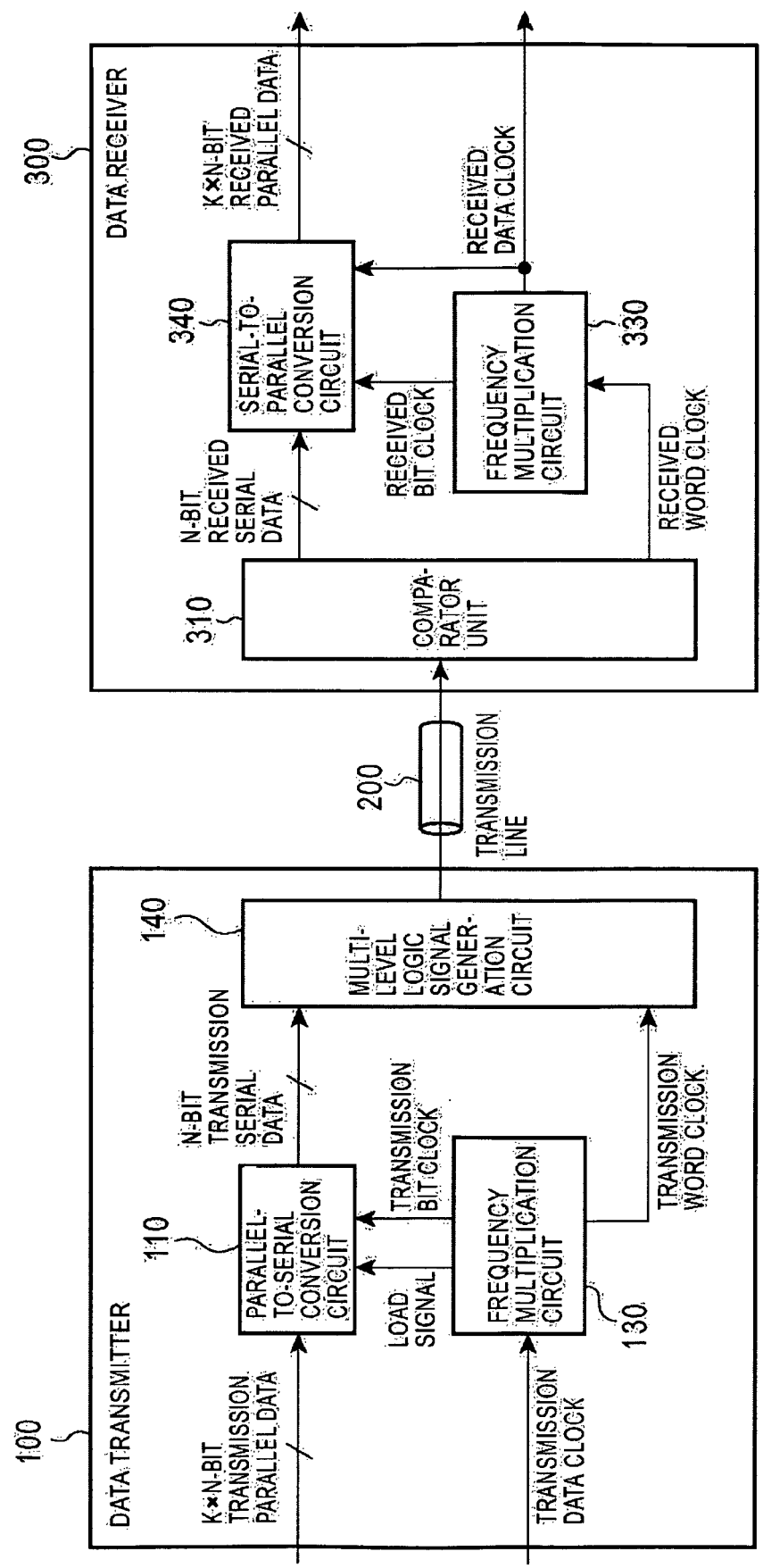
FIG. 1 is a block diagram of a data transfer system according to a first embodiment of the present invention.

FIG. 1 is a block diagram of the data transfer system according to the first embodiment of the present invention.

According to the first embodiment, the data transfer system includes a data transmitter 100 and a data receiver 300. The data transmitter 100 converts multi-bit transmission parallel data to be transferred into transmission serial data, combines a transmission word clock, indicating a word delimiter of the transmission serial data, as one-bit information with the transmission serial data to generate a multi-level logic signal representing a plurality of bits of information in one symbol, and then transmits the multi-level logic signal to a transmission line 200. The data receiver 300 receives the multi-level logic signal through the transmission line 200, extracts received serial data that is the same as the transmission serial data and a received word clock that is the same as the transmission word clock from the received signal, and reproduces received parallel data that is the same as the transmission parallel data on the basis of the extracted word clock.

The data transmitter 100 includes a parallel-to-serial conversion circuit 110, a frequency multiplication circuit 130, and a multi-level logic signal generation circuit 140. The parallel-to-serial conversion circuit 110 converts multi-bit (K×N-bit) transmission parallel data into N-bit transmission serial data. The frequency multiplication circuit 130 multiplies a transmission data clock, which the transmission parallel data is synchronized with, namely, multiplies the frequency of the data clock by a factor of K to produce a transmission bit clock which is necessary for the operation of the parallel-to-serial conversion circuit 110 and also generates a transmission word clock indicating a word delimiter in the transmission serial data based on the transmission data clock. The multi-level logic signal generation circuit 140 combines the N-bit transmission serial data with the transmission word clock, that is a 1-bit signal, to generate a multi-level logic signal representing N+1-bit information in one symbol.

In this instance, one symbol means a period of time during which one value is held. For example, when parallel data is converted into N=2-bit transmission serial data, (N+1=3)-bit information, i.e., $2^{(N+1)}=8$-level information is held in one symbol.

The data receiver 300 includes a comparator unit 310, a frequency multiplication circuit 330, and a serial-to-parallel conversion circuit 340. The comparator unit 310 compares reference voltages with the multi-level logic signal transmitted from the data transmitter 100 through the transmission line 200 to extract received serial data that is the same as the transmission serial data and a received word clock that is the same as the transmission word clock from the received signal. The frequency multiplication circuit 330 multiplies the frequency of the received word clock by a factor of K to generate a received bit clock serving as a trigger used to identify data in each symbol. The serial-to-parallel conversion circuit 340 converts the received serial data into received parallel data in accordance with received bit clock and the received data clock.

The operation of the data transfer system in FIG. 1 will now be described in brief.

In the data transmitter 100, when K×N-bit transmission parallel data is supplied to the parallel-to-serial conversion circuit 110, the frequency multiplication circuit 130 multiplies the frequency of a transmission data clock synchronized with the transmission parallel data by a factor of K to generate a transmission bit clock and further generates a load signal to determine output timing of the parallel-to-serial conversion circuit 110. The frequency multiplication circuit 130 also generates a transmission word clock that is equivalent to the transmission data clock.

The parallel-to-serial conversion circuit 110 converts the K×N-bit transmission parallel data into N-bit transmission serial data on the basis of the transmission bit clock and then outputs the serial data to the multi-level logic signal generation circuit 140 in accordance with the load signal.

The multi-level logic signal generation circuit 140 combines the supplied N-bit transmission serial data with the 1-bit transmission word clock into N+1-bit data, converts this data into a multi-level, i.e., $2^{(N+1)}$-level logic signal in one symbol, and then transmits the signal to the transmission line 200.

When the data receiver 300 receives the multi-level logic signal from the data transmitter 100 through the transmission line 200, the comparator unit 310 compares reference voltages with the value of the multi-level logic signal to quantize the signal and extracts received serial data that is the same as the transmission serial data and a received word clock that is the same as the transmission bit clock from the quantized signal.

The frequency multiplication circuit 330 multiplies the frequency of the received word clock by a factor of K to generate a received bit clock and also generates a received data clock to be synchronized with the received parallel data, the received data clock being equivalent to the received word clock.

The serial-to-parallel conversion circuit 340 converts the N-bit received serial data into K×N-bit received parallel data in accordance with the received bit clock and the received data clock and then outputs the resultant data.

Subsequently, providing that K=4 and N=2, i.e., K×N=8 bits of data is transferred, the operation of the data transfer system according to the first embodiment will now be described in detail.

Figure 2:
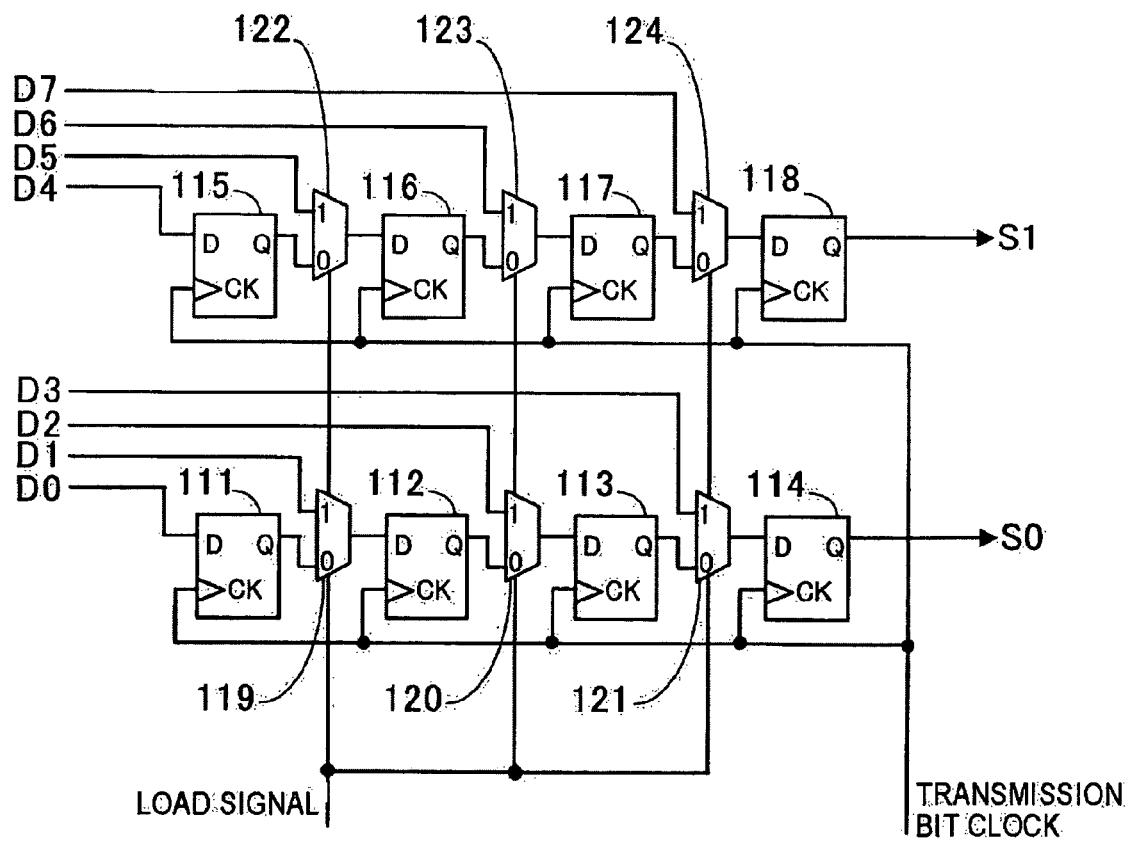
FIG. 2 is a circuit diagram of a parallel-to-serial conversion circuit of a data transmitter.

FIG. 2 is a circuit diagram of the parallel-to-serial conversion circuit of the data transmitter.

In this case, the parallel-to-serial conversion circuit converts 8-bit transmission parallel data into 2-bit transmission serial data.

The parallel-to-serial conversion circuit includes a circuit segment for converting data D0 to D3 of the transmission parallel data into transmission serial data S0 and another circuit segment for converting data D4 to D7 thereof into transmission serial data S1.

The circuit segment, which converts the data D0 to D3 into the transmission serial data S0, includes D flip flops (FFs) 111 to 114 and selectors 119 to 121.

The data D0 is supplied to an input terminal of the FF 111, the data D1 is supplied to one input terminal of the selector 119, the data D2 is supplied to one input terminal of the selector 120, and the data D3 is supplied to one input terminal of the selector 121.

An output terminal of the FF 111 is connected to the other input terminal of the selector 119. An output terminal of the selector 119 is connected to an input terminal of the FF 112. An output terminal of the FF 112 is connected to the other input terminal of the selector 120. An output terminal of the selector 120 is connected to an input terminal of the FF 113. An output terminal of the FF 113 is connected to the other input terminal of the selector 121. An output terminal of the selector 121 is connected to an input terminal of the FF 114. The FF 114 outputs the one-bit transmission serial data S0.

The data D0 to D3 are input to the FFs 111 to 114, respectively, in accordance with the rising edge of the transmission bit clock supplied to respective clock terminals of the FFs 111 to 114 for a period of time during which the load signal supplied to the selectors 119 to 121 is in a level "H" (high). When the load signal supplied to the selectors 119 to 121 becomes a level "L" (low), the outputs of the respective FFs are sequentially supplied to the corresponding selectors in accordance with the rising edge of the transmission bit clock. Thus, the FF 114 outputs the one-bit transmission serial data S0.

The circuit segment for converting the data D4 to D7 into the transmission serial data S1 includes FFs 115 to 118 and selectors 122 to 124. The circuit configuration is the same as that of the above-mentioned circuit segment for generating the transmission serial data S0. In other words, when the load signal goes to, for example, the level "L", outputs of the respective FFs are sequentially supplied to the corresponding selectors in accordance with the transmission bit clock. Thus, the FF 118 outputs the transmission serial data S1.

Figure 3:
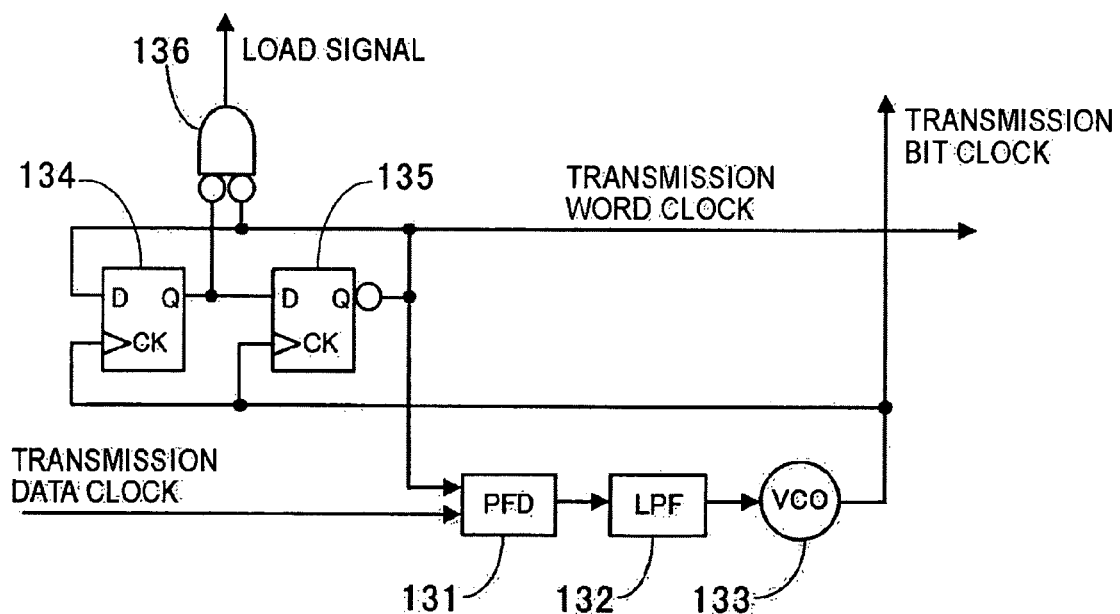
FIG. 3 is a circuit diagram of a frequency multiplication circuit of the data transmitter.

FIG. 3 is a circuit diagram of the frequency multiplication circuit of the data transmitter.

The frequency multiplication circuit includes a phase frequency detector (PFD) 131 serving as a phase comparator, a low pass filter or a loop filter (LPF) 132, a voltage controlled oscillator (VCO) 133, FFs 134 and 135, and an AND circuit 136.

The PFD 131 receives a transmission word clock serving as an output of the FF 135 and a transmission data clock and compares the phases of the respective clock signals. An output of the PFD 131 is supplied to the VCO 133 through the LPF 132. The VCO 133 generates a transmission bit clock, of which frequency is four times as high as that of the transmission data clock. The transmission bit clock is generated from the frequency multiplication circuit. The generated transmission bit clock is also supplied as a clock signal to the FFs 134 and 135. A circuit, composed of the FFs 134 and 135 connected in series, functions as a ¼ frequency divider. The transmission word clock serving as an output of the frequency divider, namely, the FF 135 is supplied to the preceding FF 134 and one input terminal of the PFD 131. The above-mentioned phase locked loop (PLL) configuration generates a transmission word clock, of which frequency and phase match those of a supplied transmission data clock. The frequency multiplication circuit outputs such a transmission word clock.

An output signal of the FF 134 and a signal obtained by inverting the output signal of the FF 135 are supplied to the AND circuit 136. An output of the AND circuit 136 is generated as a load signal from the frequency multiplication circuit.

Figure 4:
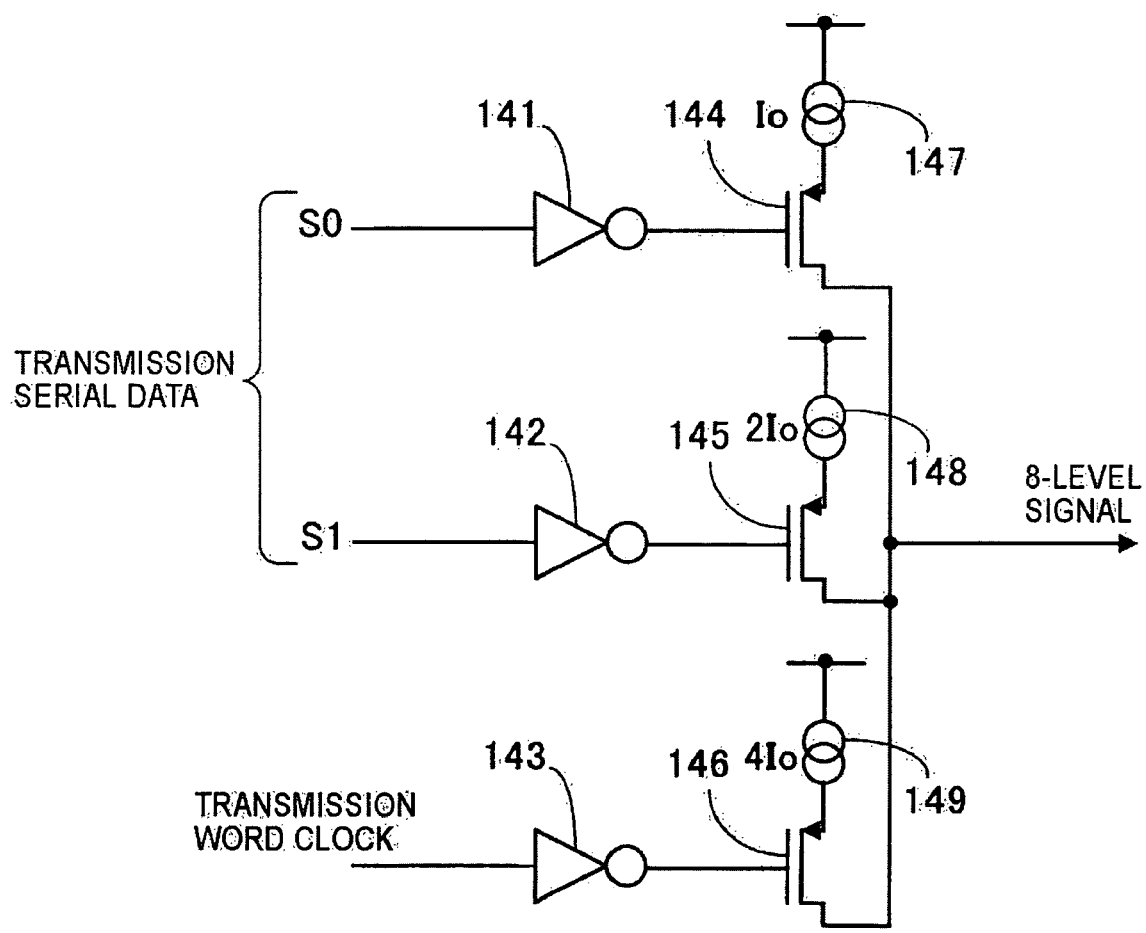
FIG. 4 is a circuit diagram of a multi-level logic signal generation circuit of the data transmitter.

FIG. 4 is a circuit diagram of the multi-level logic signal generation circuit of the data transmitter.

In this instance, the multi-level logic signal generation circuit receives two-bit transmission serial data and a one-bit transmission word clock to generate an eight-level signal.

The transmission serial data S0 and S1 are supplied to inverters 141 and 142, respectively. The transmission word clock is supplied to an inverter 143. An output terminal of the inverter 141 is connected to the gate of a p-channel metal-oxide-semiconductor field effect transistor (PMOS) 144. An output terminal of the inverter 142 is connected to the gate of a PMOS 145. An output terminal of the inverter 143 is connected to the gate of a PMOS 146. The source terminal of the PMOS 144 is connected to a current source 147, so that current Io flows through the PMOS 144. The source terminal of the pMOS 145 is connected to a current source 148, so that current 2Io flows through the PMOS 145. The source terminal of the PMOS 146 is connected to a current source 149, so that current 4Io flows through the PMOS 146. The drain terminals of the pMOSs 145 to 147 are connected to each other. The total current of outputs of the drain terminals is generated as an eight-level signal from the multi-level logic signal generation circuit. In this case, the eight-level current is proportional to a three-bit binary number in which the transmission word clock is the most significant bit (MSB). The content of three bits and transmission data have the correspondence shown in FIG. 5.

FIG. 5 shows the correspondence of multi-level logic and transmission data.

The correspondence of input signals and output signals of the multi-level logic signal generation circuit in FIG. 4 of the data transmitter will now be described. That on the receiving side will be described later.

Referring to FIG. 5, output current of the data transmitter has eight-level values determined depending on the values of the transmission word clock and the transmission serial data S1 and S0 supplied to the multi-level logic signal generation circuit. When all of the transmission word clock and the transmission serial data S1 and S0 indicate "1", the pMOSs 144 to 146 in FIG. 4 turn on, so that an output current of Io+2Io+4Io=7Io flows. This output current indicates the maximum value. On the other hand, when all of the transmission word clock and the transmission serial data S1 and S0 indicate "0", all of the pMOSs 144 to 146 turn off, so that the output current indicates "0", which is the minimum value.

The above-mentioned signal is transmitted from the data transmitter to the data receiver through the transmission line.

Figure 6:
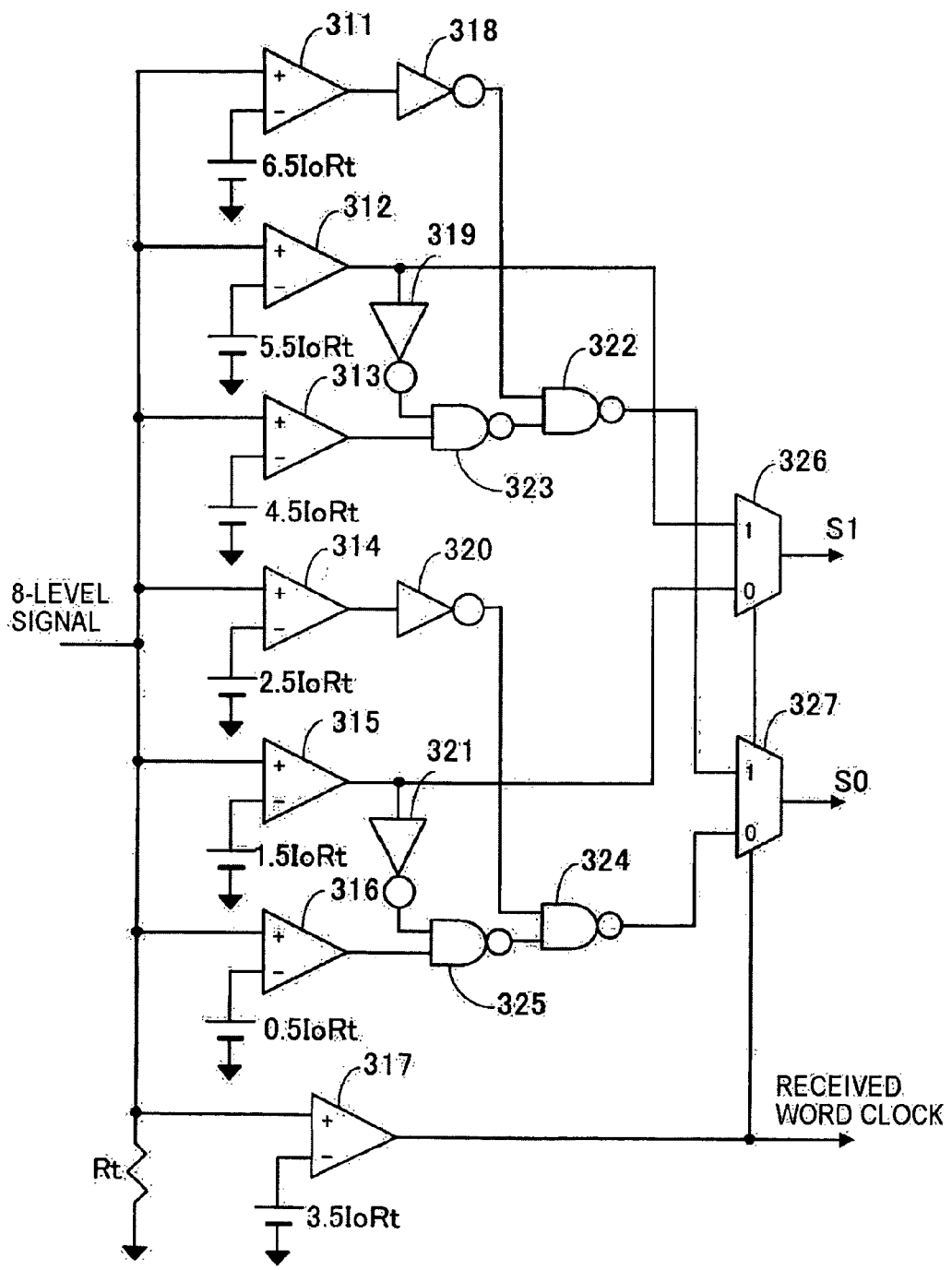
FIG. 6 is a circuit diagram of a comparator unit of a data receiver.

FIG. 6 is a circuit diagram of the comparator unit of the data receiver.

The comparator unit has a function of detecting an eight-level signal transmitted from the data transmitter.

The comparator unit includes a termination resistor Rt for transforming a supplied eight-level current signal into an eight-level voltage and comparators 311 to 317 for comparing a received voltage with a plurality of reference voltages to detect an eight-level signal.

An output of the comparator 311 for comparing the received voltage with a reference voltage 6.5IoRt is supplied to one input terminal of a NAND circuit 322 through an inverter 318. An output of the comparator 312 for comparing the received voltage with a reference voltage 5.5IoRt is supplied to one input terminal of a selector 326 and is also supplied to one input terminal of a NAND circuit 323 through an inverter 319. An output of the comparator 313 for comparing the received voltage with a reference voltage 4.5IoRt is supplied to the other input terminal of the NAND circuit 323.

An output of the NAND circuit 323 is input to the other input terminal of the NAND circuit 322 and an output of the NAND circuit 322 is supplied to one input terminal of a selector 327.

An output of the comparator 314 for comparing the received voltage with a reference voltage 2.5IoRt is supplied to one input terminal of a NAND circuit 324 through an inverter 320. An output of the comparator 315 for comparing the received voltage with a reference voltage 1.5IoRt is supplied to the other input terminal of the selector 326 and is also supplied to one input terminal of a NAND circuit 325 through an inverter 321.

An output of the comparator 316 for comparing the received voltage with a reference voltage 0.5IoRt is supplied to the other input terminal of the NAND circuit 325. An output of the NAND circuit 325 is input to the other input terminal of the NAND circuit 324. An output of the NAND circuit 324 is supplied to the other input terminal of the selector 327.

When the transmission word clock determines a transmission signal level, the transmission word clock indicates the MSB. Therefore, the comparator 317, which compares the received voltage with a reference voltage 3.5IoRt, extracts a received word clock. An output of the comparator 317 is supplied to the selectors 326 and 327 and is also externally generated from the comparator unit.

The selector 326 outputs received serial data S1 and the selector 327 generates received serial data S0.

As mentioned above, two bits of the received serial data S0 and S1 are obtained by logically operating information which is obtained by quantizing the received voltage through the six comparators 311 to 316.

According to the above-mentioned circuit configuration, the received voltage is compared to the respective reference voltages. Consequently, as shown in FIG. 5, on condition that the received word clock indicates "1", the combination of the received serial data S1 and S0 includes "00", "01", "10", and "11" and, on condition that the received word clock indicates "0", the combination of the received serial data S1 and S0 includes "00", "01", "10", and "11". In other words, eight values are obtained in total as the combination of the received word clock and the received serial data S1 and S0.

Figure 7:
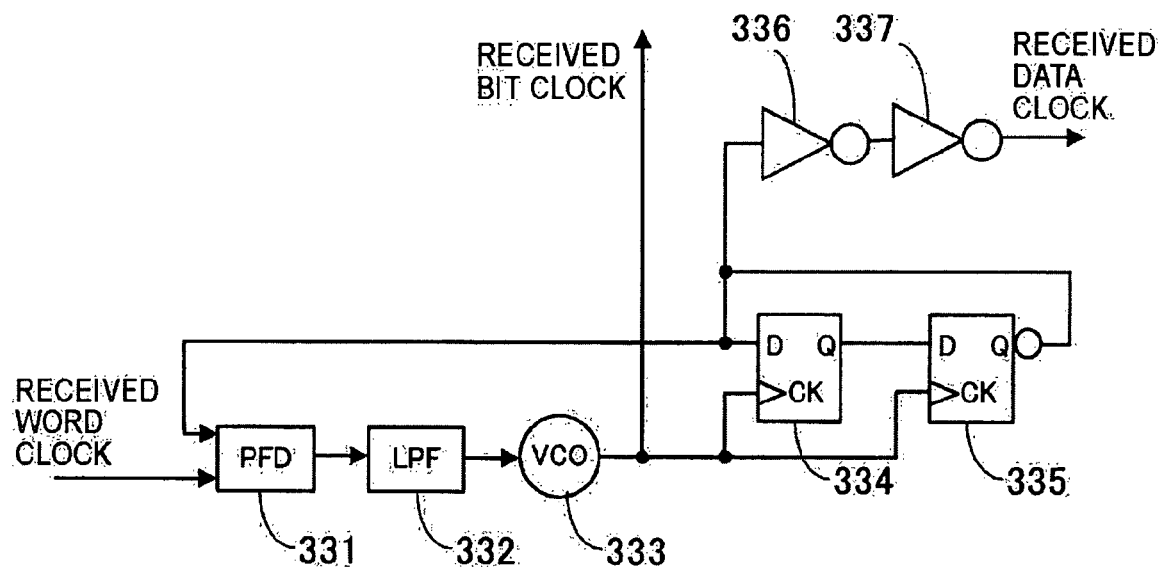
FIG. 7 is a circuit diagram of a frequency multiplication circuit of the data receiver.

FIG. 7 is a circuit diagram of the frequency multiplication circuit of the data receiver.

Similar to that of the data transmitter in FIG. 3, the frequency multiplication circuit of the data transmitter also includes a PFD 331, an LPF 332, a VCO 333, FFs 334 and 335, and inverters 336 and 337.

The PFD 331 receives an output of the FF 335 and a received word clock and compares the phases of the respective signals. An output of the PFD 331 is supplied to the VCO 333 through the LPF 332. The VCO 333 recovers a received bit clock, of which frequency is four times as high as that of the received word clock. The received bit clock is generated as a trigger, which is used to identify data in each symbol, from the frequency multiplication circuit. The received bit clock is also supplied as a clock signal to the FFs 334 and 335. A circuit, composed of the FFs 334 and 335 connected in series, functions as a ¼ frequency divider. An output of the frequency divider, namely, the FF 335 is supplied to the preceding FF 334 and one input terminal of the PFD 331. The above-mentioned PLL configuration generates a received bit clock, of which frequency and phase match those of a supplied received word clock. The frequency multiplication circuit generates such a received bit clock.

Further, the output of the frequency divider is generated as a received data clock from the frequency multiplication circuit through the inverters 336 and 337.

Figure 8:
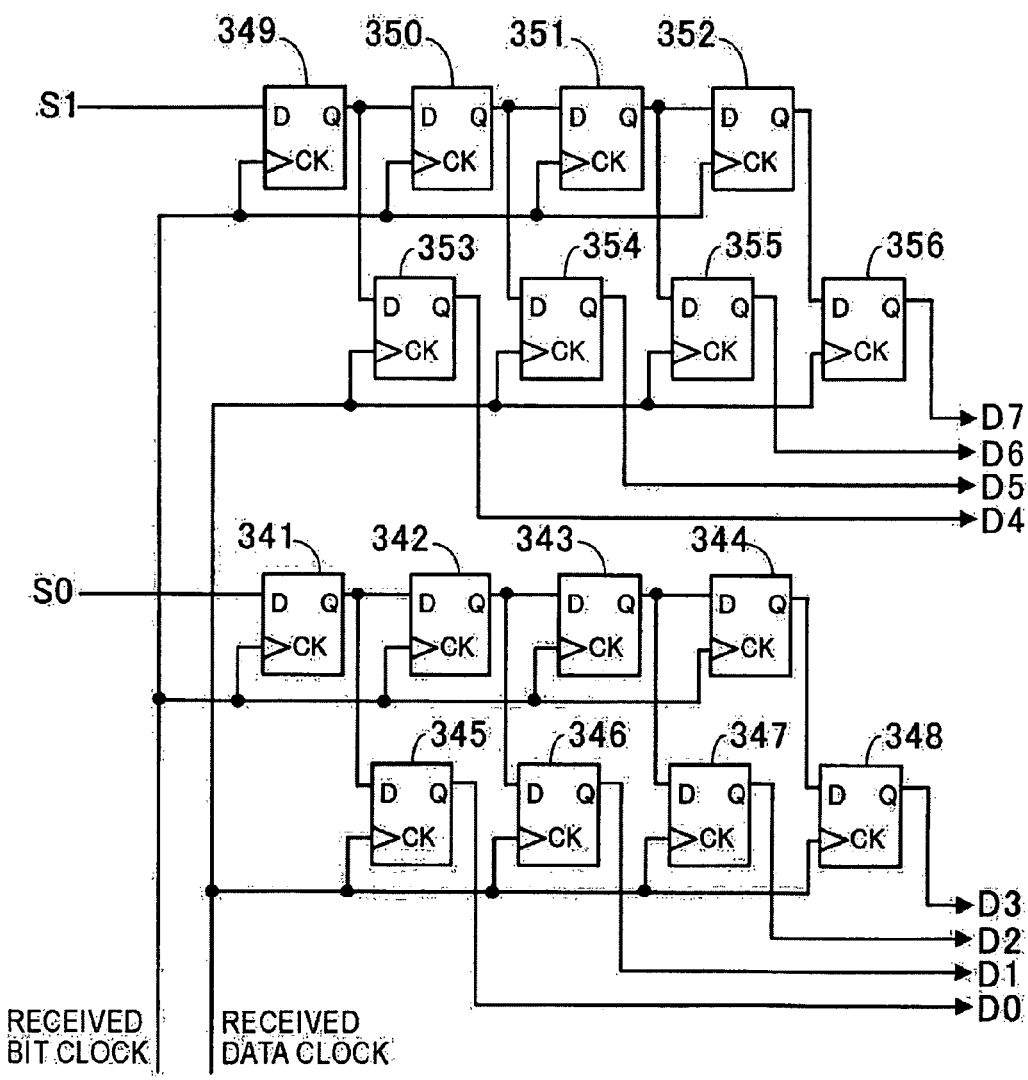
FIG. 8 is a circuit diagram of a serial-to-parallel conversion circuit of the data transmitter.

FIG. 8 is a circuit diagram of the serial-to-parallel conversion circuit of the data receiver.

In this case, the serial-to-parallel conversion circuit reproduces eight-bit received parallel data, which is equivalent to transmission parallel data, from two-bit received serial data.

The serial-to-parallel conversion circuit is composed of a circuit segment for converting received serial data S0 into data D0 to D3 of received parallel data and a circuit segment for converting received serial data S1 into data D4 to D7 thereof.

The circuit segment for converting the received serial data S0 into the data D0 to D3 includes FFs 341 to 344, which constitute a shift register, and FFs 345 to 348, which constitute a parallel register.

The FFs 341 to 344 constituting the shift register are connected in series. The received serial data S0 is supplied to the FF 341 at the first stage. A received bit clock is supplied as a shift trigger to respective clock terminals of the FFs 341 to 344.

Output of the FFs 341 to 344 are respectively supplied to input terminals of the FFs 345 to 348, which constitute the parallel resister and a received data clock is supplied to respective clock terminals of the FFs 345 to 348, so that the FFs are sequentially triggered. On the basis of the trigger, the received serial data flowing through the shift register is sampled at correct timing. Thus, received parallel data, that is the same as transmission parallel data, can be generated. Since a word clock determines timing of parallel-to-serial conversion in the data transmitter, the conversion in the serial-to-parallel conversion circuit can be ruled such that the MSB indicating a word clock and going from the level "L" to the level "H" is positioned at the head of each word in eight-level symbols, which are successively transmitted.

According to the above-mentioned configuration, the received serial data S0 is supplied in accordance with the received bit clock and the data D0 to D3 are generated in parallel on the basis of the received data clock.

The circuit segment for converting the received serial data S1 into the data D4 to D7 also includes FFs 349 to 352 constituting a shift register and FFs 353 to 356 constituting a parallel register. This circuit segment has the same circuit configuration as that of the circuit segment for converting the received serial data S0 into the data D0 to D3. The circuit segment receives the received serial data S1 in accordance with the received bit clock and generates the data D4 to D7 in parallel on the basis of the received data clock.

Signal flow in transmitting and receiving a K×N=8-bit signal in the data transfer system according to the first embodiment will now be described using a timing chart.

Figure 9:
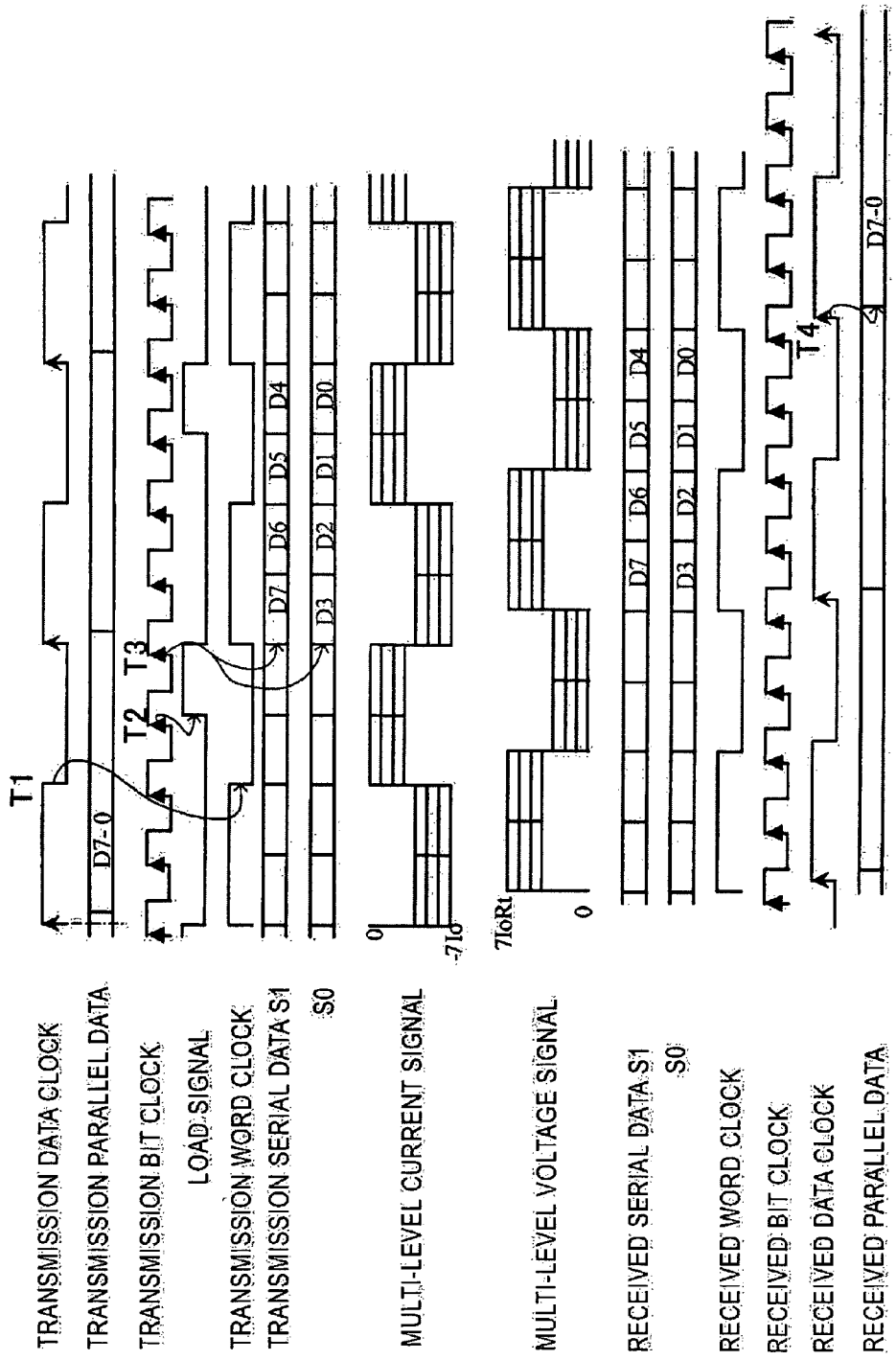
FIG. 9 is a timing chart of a process of the data transfer system according to the first embodiment.

FIG. 9 is a timing chart of a process of the data transfer system according to the first embodiment.

When transmission parallel data D7-0 is supplied to the parallel-to-serial conversion circuit of the data transmitter and a transmission data clock is input to the frequency multiplication circuit thereof, the frequency multiplication circuit generates a transmission bit clock, obtained by multiplying the frequency of the transmission data clock by a factor of 4, a load signal, and a transmission word clock. When the transmission word clock becomes the level "L" synchronously with the transmission data clock (T1), the load signal goes to the level "H" synchronously with the rising edge of the transmission bit clock (T2).

On the other hand, in the parallel-to-serial conversion circuit, synchronously with the transmission bit clock, data D0 to D3 of the transmission parallel data D7-0 are supplied to the FFs 111 to 114 and data D4 to D7 thereof are supplied to the FFs 115 to 118, respectively. When the load signal goes to the level "H", synchronously with the rising edge of the transmission bit clock, the data D3, D2, D1, and D0 are sequentially generated as transmission serial data S0 in that order and the data D7, D6, D5, and D4 are sequentially output as transmission serial data S1 in that order (T3).

When receiving the transmission serial data S0 and S1 and the transmission word clock, the multi-level logic signal generation circuit generates three-bit data, i.e., an eight-level signal in one symbol and transmits the signal as a multi-level current signal to the transmission line.

When the data receiver receives the multi-level current signal through the transmission line, the termination resistor Rt in the comparator unit transforms the multi-level current signal into a multi-level (eight-level) voltage signal. Further, the comparators 311 to 317 extract an eight-level signal and a received word clock. The comparator unit generates received serial data S0 and S1 and the received word clock.

When receiving the received word clock, the frequency multiplication circuit of the data transmitter recovers a received bit clock, obtained by multiplying the frequency of the received word clock by four times, and a received data clock synchronized with the received word clock and then generates the clocks.

In the serial-to-parallel conversion circuit of the data receiver, in accordance with the received bit clock, the received serial data S0 and S1 are supplied to the FFs 341 to 344 and the FFs 349 to 352, respectively. In response to the rising edge of the received data clock, the FFs 345 to 348 and the FFs 353 to 356 generate received parallel data D7-0 (T4).

In the above-mentioned case, in the data receiver, the comparator unit includes a plurality of comparators for extracting the received bit clock and the received word clock from the multi-level logic signal. An analog-to-digital-converter can also be used.

Second Embodiment

A data transfer system according to a second embodiment of the present invention will now be described.

In high speed wire communication, voltage swing which can be used as a transmission signal is up to several hundreds of mV at the maximum in terms of electromagnetic interference (EMI) and power consumption. For a multi-level signal using divided voltage swing segments, disadvantageously, noise margin is reduced. In order to accomplish transmission with a small noise margin and no errors, high external noise immunity and precise impedance matching between a transmission line and a termination resistor causing no reflection are of importance. Further, it is important to identify received data at the optimum timing at which the maximum noise margin can be obtained.

The data transfer system according to the second embodiment of the present invention is made in consideration of the above problems.

Figure 10:
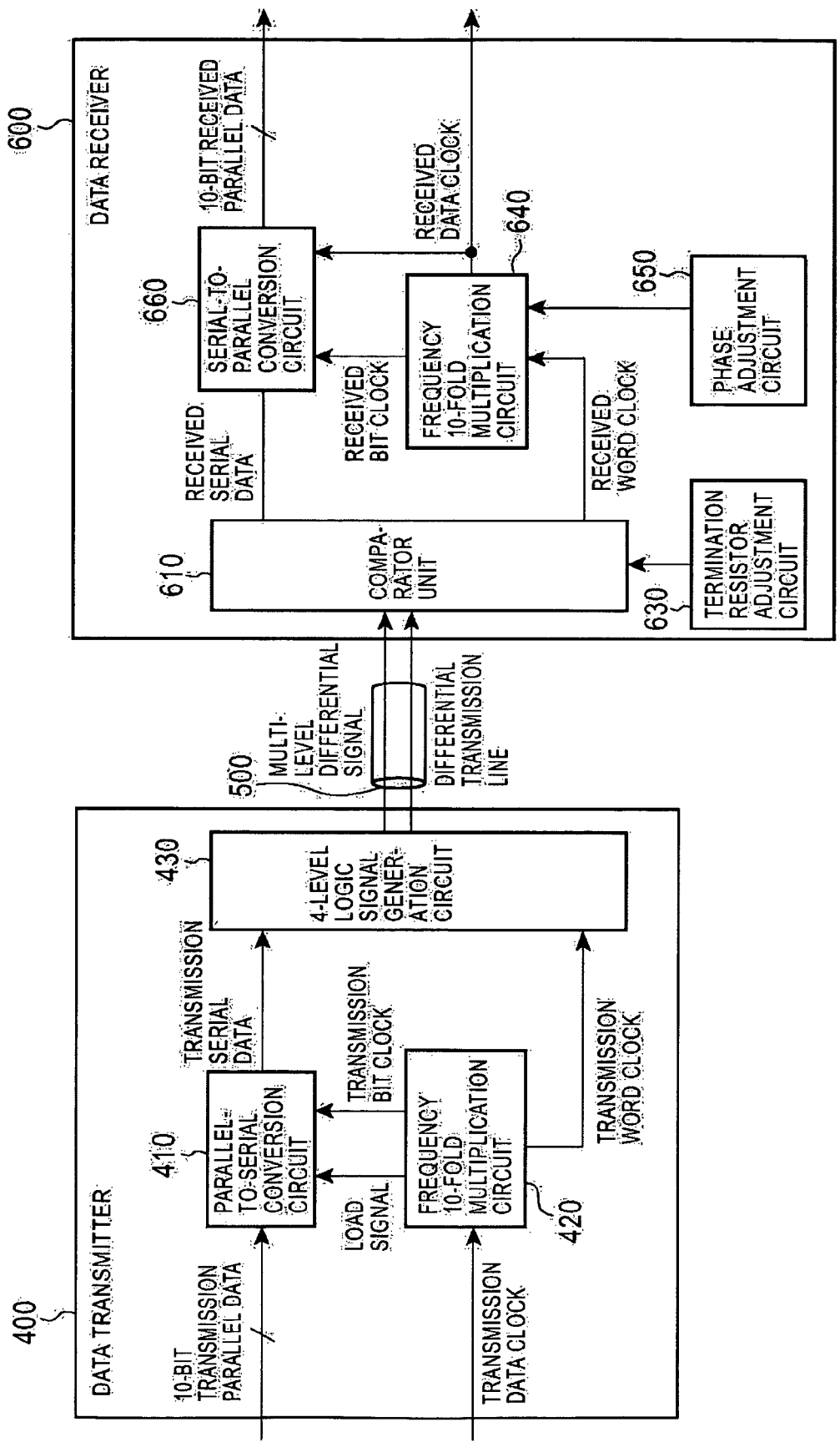
FIG. 10 is a block diagram of a data transfer system according to a second embodiment of the present invention.

FIG. 10 is a block diagram of the data transfer system according to the second embodiment of the present invention.

According to the second embodiment, the present data transfer system includes a data transmitter 400 and a data receiver 600 in the same way as the data transfer system according to the first embodiment. The data transmitter 400 converts a plurality of bits of transmission parallel data into transmission serial data, combines a transmission word clock, indicating a word delimiter in the transmission serial data, as one-bit information with the transmission serial data to generate a multi-level logic signal representing a plurality of bits of information in one symbol, and then transmits the signal to a transmission line 500. The data receiver 600 receives the multi-level logic signal through the transmission line 500, extracts received serial data that is the same as the transmission serial data and a received word clock that is the same as the transmission word clock, and reproduces received parallel data that is the same as the transmission parallel data on the basis of the extracted word clock.

The transmission line 500 is different from the transmission line 200 according to the first embodiment. A differential transmission line through which a multi-level differential signal is transmitted is used as the transmission line 500. Thus, the external noise immunity of the transmission line 500 can be increased.

In the data transfer system according to the second embodiment, the data transmitter 400 includes a parallel-to-serial conversion circuit 410, a frequency (ten-fold) multiplication circuit 420, and a multi-level (four-level) logic signal generation circuit 430. The data transmitter 400 converts K×N=10-bit transmission parallel data into N=1-bit transmission serial data and then converts the data into multi-level ($2^{(N+1)}=4$-level) data.

The circuit configuration of the parallel-to-serial conversion circuit 410 for converting ten-bit transmission parallel data into one-bit transmission serial data is not shown. The parallel-to-serial conversion circuit 410 can be realized by using flip flops similar to those for generating transmission serial data S0 and S1 in the above-mentioned parallel-to-serial circuit for converting eight-bit transmission parallel data into two-bit transmission serial data in FIG. 2. In other words, the parallel-to-serial conversion circuit 410 can be realized by connecting ten flip flops for generating transmission serial data in series through selectors.

The circuit configuration of the frequency ten-fold multiplication circuit 420 is also not shown. The frequency ten-fold multiplication circuit 420 can be realized by arranging five flip flops serving as a $\frac{1}{10}$ frequency divider in a manner similar to the above-mentioned frequency (four-fold) multiplication circuit in FIG. 3.

The four-level logic signal generation circuit 430 for generating a four-level differential signal will now be described below.

Figure 11:
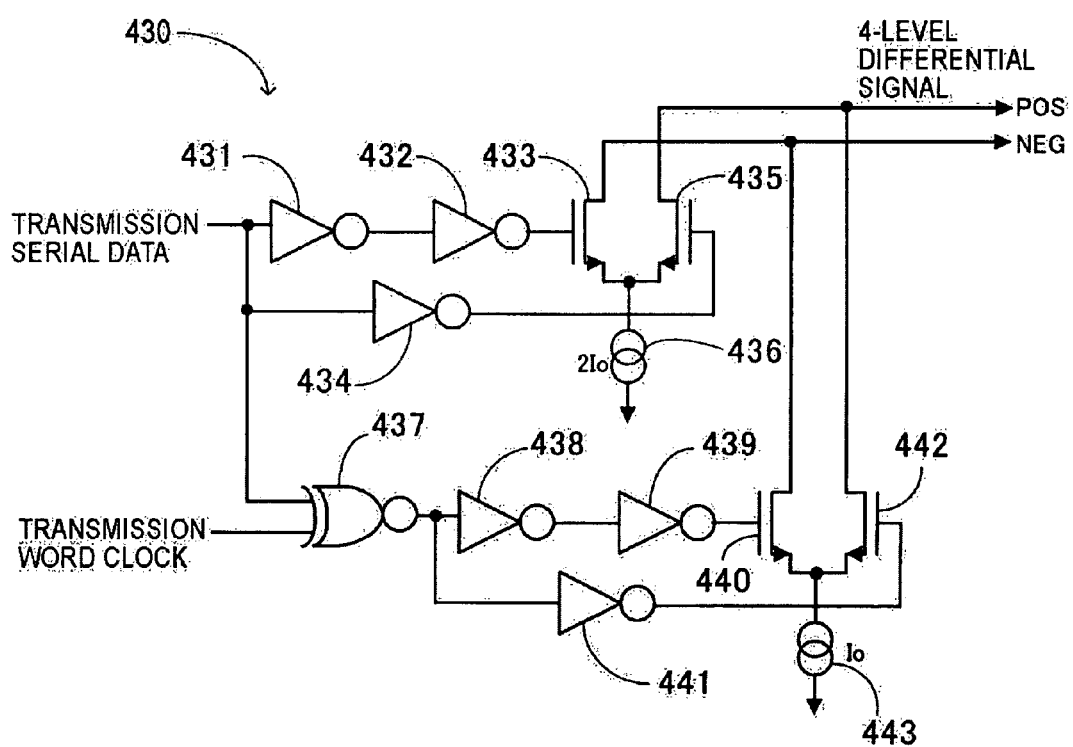
FIG. 11 is a circuit diagram of a four-level logic signal generation circuit.

FIG. 11 is a circuit diagram of the four-level logic signal generation circuit 430.

In the four-level logic signal generation circuit 430, transmission serial data is supplied to the gate of an n-channel MOSFET (nMOS) 433 through inverters 431 and 432 and is also supplied to the gate of an nMOS 435 through an inverter 434. The respective source terminals of the nMOSs 433 and 435 are connected to a current source 436, so that current 2Io flows through the nMOSs 433 and 435.

The transmission serial data is supplied to one input terminal of an EX-NOR circuit 437. A transmission word clock is supplied to the other input terminal thereof. An output of the EX-NOR circuit 437 is supplied to the gate of an nMOS 440 through inverters 438 and 439 and is also supplied to the gate of an NMOS 442 through an inverter 441. The respective source terminals of the nMOSs 440 and 442 are connected to a current source 443, so that current Io flows in the nMOSs 440 and 442. The drain terminal of the nMOS 440 is connected to the drain terminal of the nMOS 433 and a negative (NEG) terminal (not shown) which a negative (NEG) signal component of a four-level differential signal is transmitted from. The drain terminal of the nMOS 442 is connected to the drain terminal of the nMOS 435 and a positive (POS) terminal (not shown) which a positive (POS) signal component of the four-level differential signal is transmitted from.

The above-mentioned circuit configuration generates a multi-level logic signal having two-bit (four-level) information in one symbol, the signal having the following correspondence of one-bit transmission serial data and one-bit transmission word clock in FIG. 12.

FIG. 12 shows the correspondence of four-level logic and transfer data.

Referring to FIG. 12, current at the POS terminal and current at the NEG terminal each have four values depending on the value of transmission serial data and that of a transmission word clock supplied to the four-level logic signal generation circuit 430. For example, when both of the transmission serial data and the transmission word clock indicate "1", the POS terminal current indicates "0" and the NEG terminal current indicates 3Io. When the transmission serial data indicates "1" and the transmission word clock indicates "0", the POS terminal current indicates Io and the NEG terminal current indicates 2Io. When both of the transmission serial data and the transmission word clock indicate "0", the POS terminal current indicates 2Io and the NEG terminal current indicates Io. When the transmission serial data indicates "0" and the transmission word clock indicates "1", the POS terminal current indicates 3Io and the NEG terminal current indicates 0.

Figure 13:
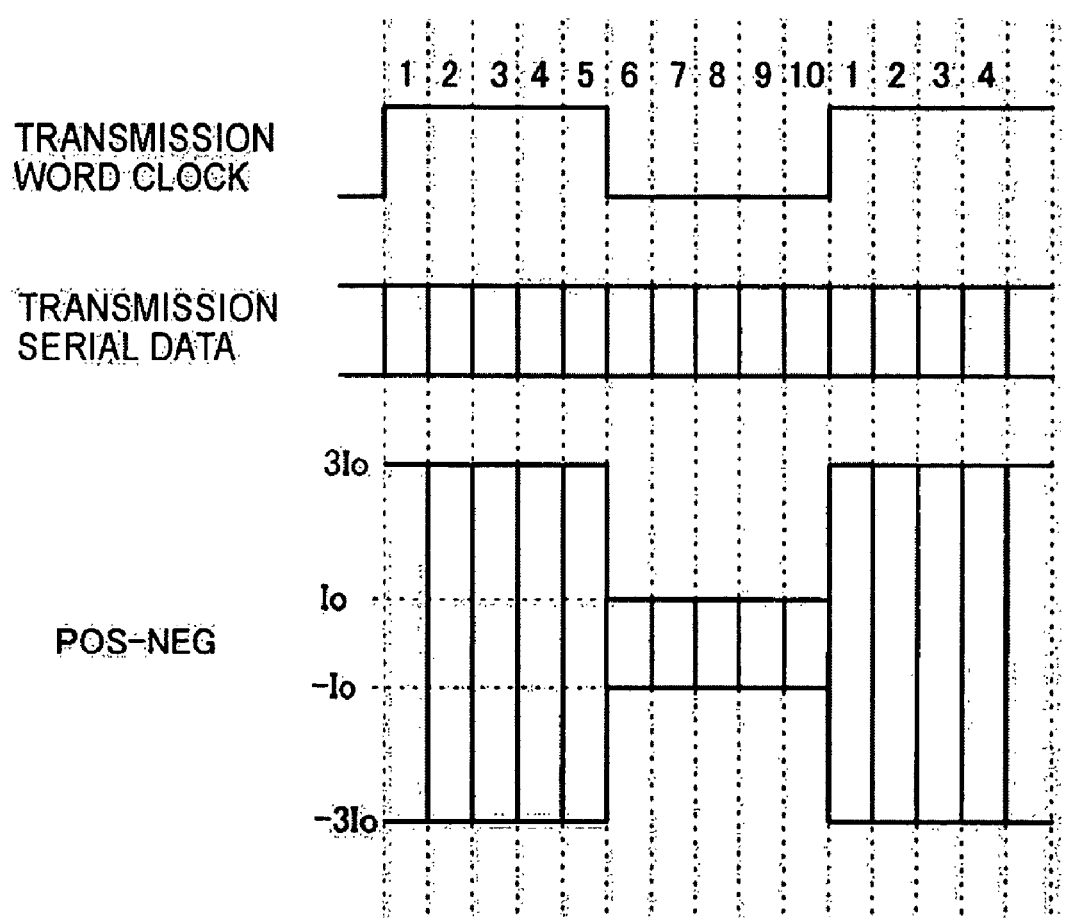
FIG. 13 is a diagram showing a four-level differential signal generated from the four-level logic signal generation circuit.

FIG. 13 shows a four-level differential signal generated from the four-level logic signal generation circuit.

In FIG. 13, the four-level differential signal indicates a value (current) of the difference between the NEG signal component and the POS signal component, i.e., (POS-NEG). When the transmission word clock is in the level "H", the difference therebetween is large, namely, the four-level differential signal has a large amplitude. On the other hand, when the transmission word clock is in the level "L", the difference therebetween is small, namely, the four-level differential signal has a small amplitude. Therefore, when the value of (POS-NEG) is 3Io, the transmission serial data indicates "0" and the transmission word clock indicates "1". When the value of (POS-NEG) is Io, both of the transmission serial data and the transmission word clock indicate "0". When the value of (POS-NEG) is –Io, the transmission serial data indicates "1" and the transmission word clock indicates "0". When the value of (POS-NEG) is –3Io, both of the transmission serial data and the transmission word clock indicate "1". The four-level differential signal has two bits, namely, four-level information in one symbol.

The multi-level logic signal is supplied from the data transmitter 400 to the data receiver 600 through the differential transmission line 500. At that time, actual current flows from the data receiver 600 to the data transmitter 400.

According to the second embodiment, similar to the data receiver of the first embodiment, the present data receiver 600 includes a comparator unit 610, a frequency (ten-fold) multiplication circuit 640, and a serial-to-parallel conversion circuit 660. The data receiver 600 further includes a termination resistor adjustment circuit 630 for matching the characteristic impedance of a termination resistor to that of the transmission line 500 and a phase adjustment circuit 650 for adjusting the phase of a received bit clock, with which received serial data is obtained synchronously.

Figure 14:
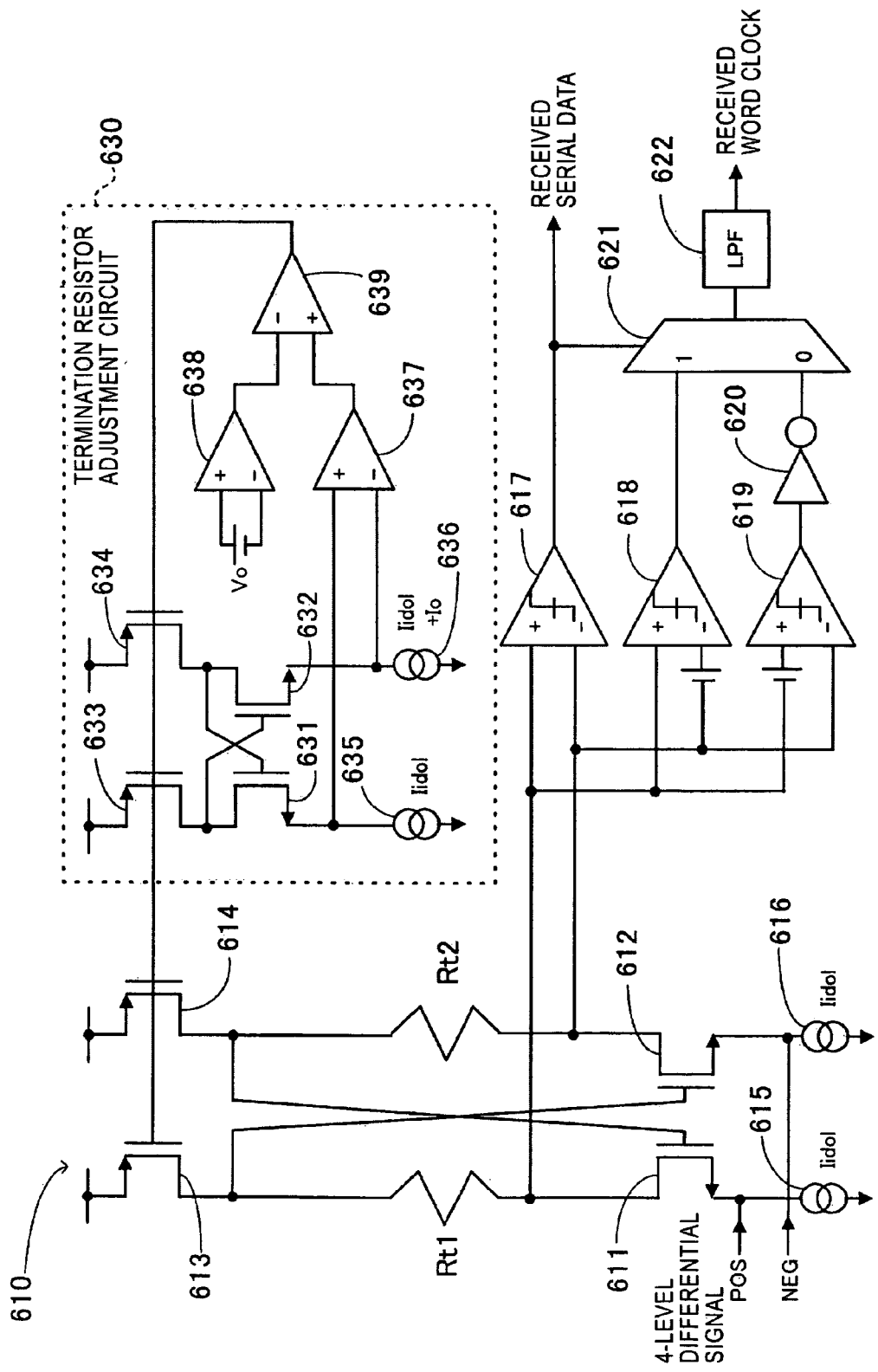
FIG. 14 is a circuit diagram showing a comparator unit and a termination resistor adjustment circuit.

FIG. 14 is a circuit diagram of the comparator unit 610 and the termination resistor adjustment circuit 630.

At the front end, the comparator unit 610 includes a cascode circuit composed of nMOSs 611 and 612, pMOSs 613 and 614, and resistors Rt1 and Rt2.

In the cascode circuit, the source terminal of the nMOS 611 is connected to a current source 615, so that a drive current Iidol flows through the nMOS 611. The source terminal of the nMOS 612 is connected to a current source 616, so that a drive current Iidol flows in the NMOS 612. The drain terminal of the nMOS 611 is connected to the drain terminal of the PMOS 613 through the resistor Rt1. The drain terminal of the NMOS 612 is connected to the drain terminal of the pMOS 614 through the resistor Rt2. The gate of the nMOS 611 is connected to the drain terminal of the PMOS 614. The gate of the nMOS 612 is connected to the drain terminal of the PMOS 613. Power source is supplied to the respective source terminals of the pMOSs 613 and 614. A signal is supplied from the termination resistor adjustment circuit 630 to the gates of the pMOSs 613 and 614.

The POS signal component and the NEG signal component, which constitute a four-level differential signal, are supplied to the source terminal of the nMOS 611 and that of the NMOS 612, respectively. Output signals of the cascode circuit are generated from the drain terminals of the nMOSs 611 and 612.

The termination resistor adjustment circuit 630 is a replica of the front end of the comparator unit 610. In the termination resistor adjustment circuit 630, nMOSs 631 and 632 and pMOSs 633 and 634 are connected in the same arrangement as that of the above-mentioned cascode circuit. The source terminal of the nMOS 631 is connected to a current source 635, so that a drive current Iidol flows through the nMOS 631. The source terminal of the nMOS 632 is connected to a current source 636, so that (the drive current Iidol+a reference current Io) flows in the nMOS 632. An output of this cascode circuit is supplied to a differential amplifier 637. A differential amplifier 639 compares an output of the differential amplifier 637 with that of a differential amplifier 638, to which a reference voltage Vo is supplied. An output of the differential amplifier 639 is supplied to the pMOSs 633 and 634 and the pMOSs 613 and 614 of the cascode circuit in the comparator unit 610.

According to the above-mentioned cascode circuit and the termination resistor adjustment circuit 630, input resistance can be matched with the relatively small characteristic impedance of the transmission line. Further, voltage swing at the receiving end is amplified with relatively large load resistance, so that a received signal with a large amplitude can be obtained in the circuit.

The output signals of the cascode circuit are supplied to three comparators 617 to 619. The comparator 617 having no offset reproduces received serial data. A received word clock is recovered by the two comparators 618 and 619 each having offset, an inverter 620 for inverting an output of the comparator 619, a selector 621 for selecting either one of outputs of the comparator 618 and the inverter 620 in accordance with an output signal of the comparator 617, and an LPF 622 for eliminating glitch.

Figure 15:
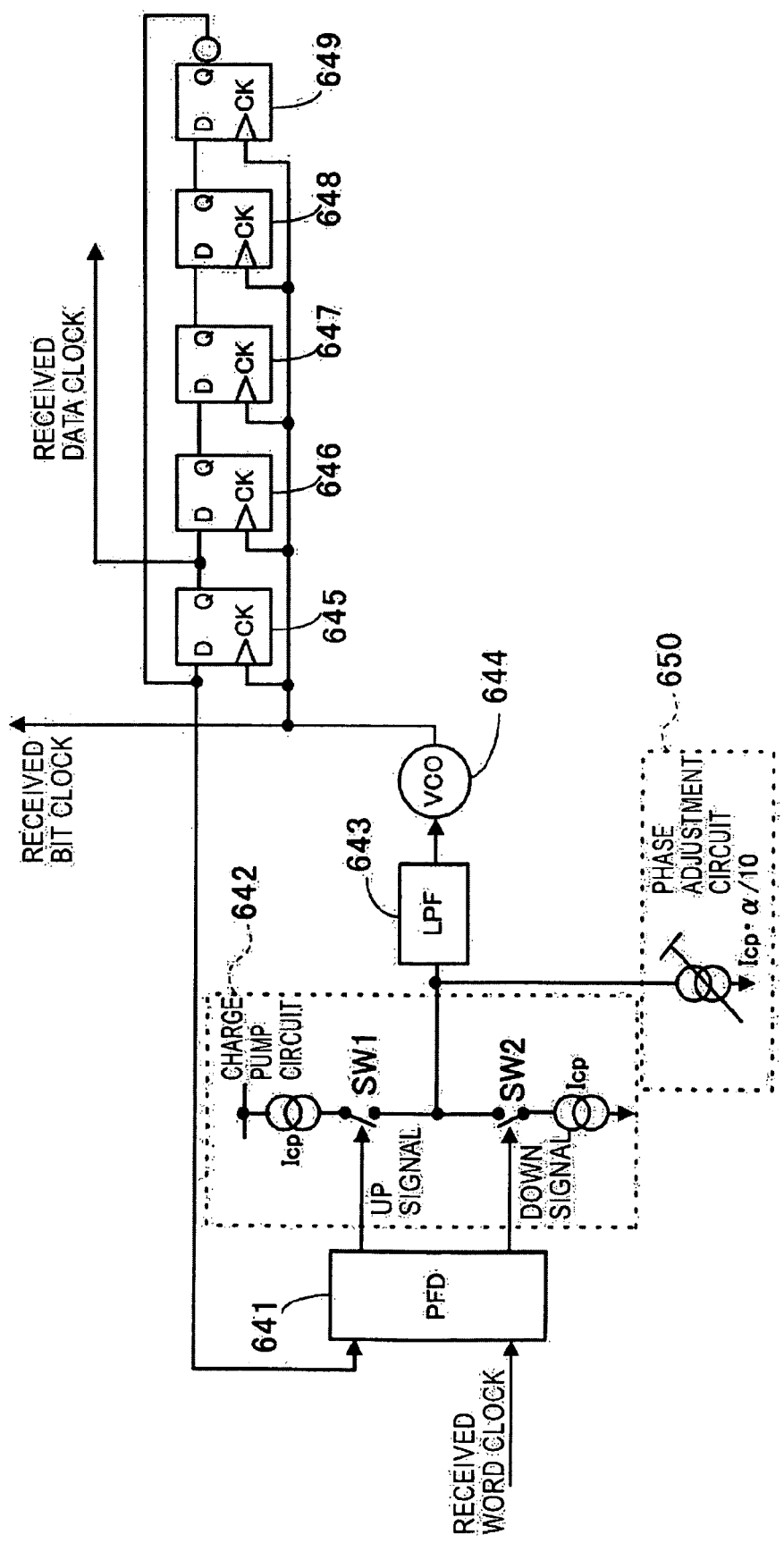
FIG. 15 is a circuit diagram showing a frequency (ten-fold) multiplication circuit and a phase adjustment circuit.

FIG. 15 is a circuit diagram of the frequency (ten-fold) multiplication circuit 640 and the phase adjustment circuit 650.

The frequency ten-fold multiplication circuit 640 includes a PFD 641, a charge pump circuit 642, an LPF 643, a VCO 644, and FFs 645 to 649. The FFs 645 to 649 function as a $\frac{1}{10}$ frequency divider. The phase adjustment circuit 650 is connected between the charge pump circuit 642 and the LPF 643.

When an UP signal is supplied from the PFD 641 to the charge pump circuit 642, a switch SW1 is turned on, so that a capacitor of the LPF 643 is charged with a charge pump current Icp. When a DOWN signal is supplied from the PFD 641 to the charge pump circuit 642, a switch SW2 is turned on, so that the capacitor of the LPF 643 is discharged and the charge pump current Icp flows.

The phase adjustment circuit 650 generates an offset current Icp·α/10 and adds the current to the charge pump current Icp, thus locking the received bit clock to the received word clock with fixed delay time. In the serial-to-parallel conversion circuit 660, generally, a received bit clock used to convert received serial data into received parallel data is synchronized with the edge of the received serial data. Accordingly, incorrect conversion may be performed. The phase adjustment circuit 650 generates delay time, so that the edge of the received bit clock can be set to timing of the maximum noise margin at which the most stable eye pattern of the received serial data is obtained.

The adjustment is performed based on such a feature that the ratio of received word clock period to delay time is equivalent to the ratio of charge pump current to offset current. The received word clock period is a constant multiple of symbol rate and is equivalent to one-bit time of serial data. Consequently, the proper setting of the ratio of charge pump current to offset current can accurately and stably synchronize the edge of the received bit clock with timing at which the maximum noise margin of the received serial data is obtained. Further, as disclosed in Japanese Patent No. 3395818, when offset current can be applied to pulses, phase adjustment can also be performed with higher accuracy.

Third Embodiment

A data transfer system according to a third embodiment of the present invention will now be described below. The present system is suitable for a case where its transmission line includes AC coupling.

According to the above-mentioned first and second embodiments, an average DC value of a multi-level logic signal when all of transmission parallel data indicate "0" differs from that when all of the transmission parallel data indicate "1". In AC-coupled transmission through which the DC component of a signal does not pass, a data receiver cannot identify the value of a multi-level logic signal because the DC component of the signal is lost, resulting in inaccurate signal reproduction.

Figure 16:
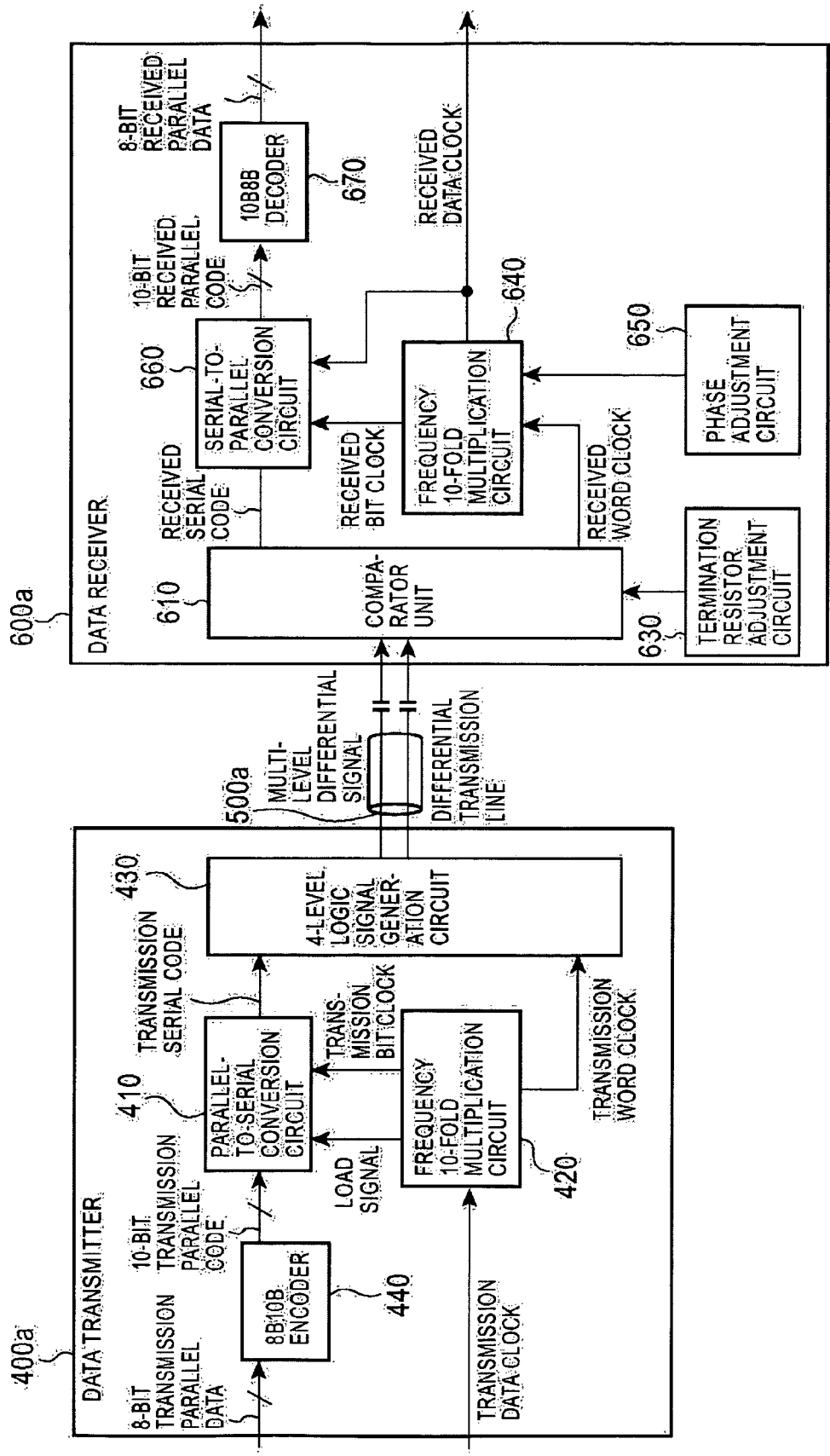
FIG. 16 is a block diagram of a data transfer system according to a third embodiment of the present invention.

FIG. 16 is a block diagram of the data transfer system according to the third embodiment of the present invention.

In the data transfer system according to the third embodiment, a data transmitter 400a includes an 8B10B encoder 440 for converting eight-bit transmission parallel data into a ten-bit transmission parallel code. The other components of the transmitter 400a are the same as those of the data transmitter 400 in FIG. 10 according to the second embodiment. The same components are designated by the same reference numerals and a description of the previously described components is omitted. The data transmitter 400a generates a four-level differential signal in the same way as the second embodiment. The signal is transmitted to a data receiver 600a through a differential transmission line 500a including AC coupling.

The data receiver 600a includes a 10B8B decoder 670 for converting a reproduced ten-bit received parallel code into eight-bit received parallel data. The other components of the data receiver 600a are the same as those of the data receiver 600 in FIG. 10 according to the second embodiment. The same components are designated by the same reference numerals and a description thereof is omitted.

According to 8-bit to 10-bit conversion, when all of eight bits of data to be converted indicate "0" or "1" or any combination of "0" and "1", a converted transmission parallel code includes "0" and "1" at the same ratio as that of the data before conversion. Therefore, the time average voltage of a four-level differential signal is balanced by differential independently of the content of eight-bit data. In the AC-coupled transmission through which the DC component of a signal does not pass, the level can be identified accurately, a received word clock can be recovered, and a received serial code can be reproduced. Further, the constant peak-to-peak value of the amplitude is ensured. Accordingly, the level of a multi-level signal to be identified is determined based on the ratio to the peak-to-peak amplitude, thus accomplishing level identification without being affected by device variations between the transmitter and the receiver.

When a data scrambler is used instead of the 8B10B encoder, the time average voltage of a four-level signal and the peak-to-peak value of the amplitude thereof can be held constant without increasing transmission signals.

In the above description, a word clock rises synchronously with the first bit when parallel data is converted into serial data and the half of a word clock period is in the level "H". The word clock is not limited to the above-mentioned waveform.

Figure 17:
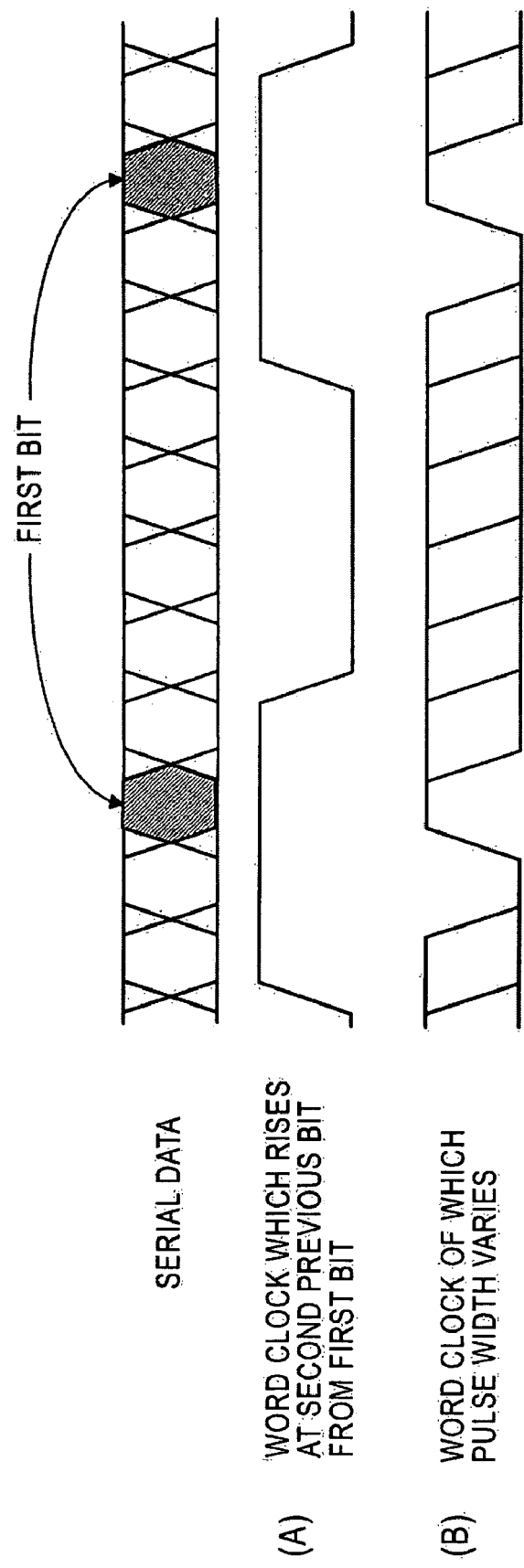
FIG. 17 includes word clock examples, part (A) showing a word clock which rises at the second previous bit from the first bit of serial data, part (B) showing another word clock, of which pulse width varies.

FIG. 17 includes word clock examples. Referring to FIG. 17, part (A) shows a word clock which rises at the second previous bit from the first bit and part (B) shows another word clock, of which pulse width varies.

As shown in part (A) of FIG. 17, the first bit of serial data corresponds to timing at which a specific number of bits pass after the rising edge of the word clock. This waveform of the word clock can also be defined.

As shown in part (B) of FIG. 17, when the rising edge of the word clock is fixed in order to indicate the head of serial data, a period of time during which the word clock is in the level "H", namely, the pulse width of the word clock can be arbitrarily set. When eight-bit parallel data is transmitted as a 2-bit four-level logic signal in one symbol, the pulse width of the word clock can flexibly vary in the range of one bit to seven bits of serial data. Two-bit information can be transmitted as a word clock with the flexible pulse width separately from eight-bit parallel data.

A reference indicating the position of the first bit of serial data may correspond to the falling edge of the word clock.

What is claimed is:

1. A data transfer system for transferring a plurality of bits of data, the system comprising:
   a data transmitter generating a serial data transmission, the serial data transmission including information defining a plurality of data bits and a word clock, the word clock transmission frequency being less than a transmission frequency of the plurality of data bits in the serial data transmission, wherein a magnitude of the serial data transmission defines a state of the word clock and a plurality of levels of the serial data transmission define digital data within the serial data transmission corresponding to the data defined by the plurality of data bits; and
   further wherein a highest possible signal level of the serial data transmission indicates a high level for the word clock signal and a lowest possible signal level of the serial data transmission indicates a low level for the word clock, the plurality of levels of the serial data transmission having signal levels between the highest possible signal level and the lowest possible signal level defining digital data, at least some of the signal levels defining digital data having a value that is less than a signal level that is midway between the highest possible and lowest possible signal levels of the serial data transmission; and
   wherein the system demultiplexes the signal levels of the serial data transmission into a separate clock output signal and plural individual data bit values for each clock output signal.

2. The system according to claim 1, wherein the data transmitter generates a multi-level logic signal in which the word clock is considered to be a most significant bit as determined by a level of the multi-level logic signal.

3. The system according to claim 1, wherein the data transmitter generates a multi-level logic signal, wherein the magnitude of amplitude indicates the word clock.

4. The system according to claim 1, wherein a data receiver compares a received multi-level logic signal with reference voltages to extract serial data and the word clock, and multiplies the extracted word clock to generate a bit clock serving as a trigger used to identify data in each symbol.

5. The system according to claim 4, wherein the data receiver includes a phase adjustment circuit for adjusting the respective phases of the word clock and the bit clock such that the word clock and the bit clock are out of phase with each other by an amount that is proportional to a period of the word clock.

6. The system according to claim 1, wherein the data receiver includes a cascode circuit for amplifying a voltage swing at the receiving end.

7. The system according to claim 1, wherein the data receiver includes a termination resistor adjustment circuit for adjusting input impedance so that the input impedance matches the characteristic impedance of the transmission line for the multi-level logic signal.

8. The system according to claim 1, wherein
the data transmitter converts parallel data using an encoder or a scrambler and then converts the resultant data into the serial data, and
the data receiver reproduces the parallel data using a decoder or a descrambler.

9. The data transfer system of claim 1, further comprising circuitry for converting a plurality of parallel data bits into a serial transmission of the data bits.

10. The data transfer system of claim 1, further wherein the word clock identifies separate data words each being comprised of a plurality of data bits.

11. A data transmitter for transmitting a plurality of bits of data comprising:
a multi-level logic signal generation circuit for generating a multi-level serial data transmission by multiplexing a plurality of data bits and a word clock, the word clock transmission frequency being less than a transmission frequency of the plurality of data bits in the serial data transmission, and wherein a magnitude of the serial data transmission defines a state of the word clock and a plurality of levels of the serial logic signal define digital data within the serial data transmission corresponding to the data bits; and
further wherein a highest possible signal level of the serial data transmission indicates a high level for the word clock signal and a lowest possible signal level of the serial data transmission indicates a low level for the word clock, the plurality of levels of the serial data transmission having signal levels between the highest possible signal level and the lowest possible signal level defining digital data, at least some of the signal levels defining digital data having a value that is less than a signal level that is midway between the highest possible and lowest possible signal levels of the serial data transmission; and
further comprising circuitry for demultiplexing the signal levels of the serial data transmission into a separate clock output signal and plural individual data bit values for each clock output signal.

12. The data transmitter according to claim 11, wherein the multi-level logic signal generation circuit generates the multi-level serial data transmission in which the word clock is the most significant bit, as determined by a level of the multi-level logic signal.

13. The data transmitter according to claim 11, wherein the multi-level logic signal generation circuit generates a multi-level logic signal, and a magnitude of amplitude indicates the word clock logic state.

14. The data transmitter according to claim 11, further comprising:
an encoder or a scrambler, placed upstream of a parallel-to-serial conversion circuit, for converting parallel data into the serial data transmission.

15. The data transmitter of claim 11, further comprising circuitry for converting a plurality of parallel data bits into a serial transmission of the data bits.

16. The data transmitter of claim 11, further wherein the word clock identifies separate data words each being comprised of a plurality of data bits.

17. A data receiver for receiving a plurality of bits of data through a serial transmission line, the data receiver comprising:
a comparator unit for comparing reference voltages with a received multi-level serial logic signal to extract serial data and a word clock, the multi-level logic signal representing a plurality of bits of information;
circuitry for generating at least one of a bit clock and a data clock based on the word clock; and
wherein the multi-level logic signal defines a word clock and a plurality of digital data words in a single serial data transmission, the word clock transmission frequency being less than a transmission frequency of the plurality of data bits in the serial data transmission, and wherein a magnitude of the serial data transmission defines a state of the word clock and a plurality of signal levels define digital data within the serial data transmission; and
further wherein a highest possible signal level of the serial data transmission indicates a high level for the word clock signal and a lowest possible signal level of the serial data transmission indicates a low level for the word clock, the plurality of levels of the serial data transmission having signal levels between the highest possible signal level and the lowest possible signal level defining digital data, at least some of the signal levels defining digital data having a value that is less than a signal level that is midway between the highest possible and lowest possible signal levels of the serial data transmission; and
wherein the system demultiplexes the signal levels of the serial data transmission into a separate clock output signal and plural individual data bit values for each clock output signal.

18. The data receiver according to claim 17, further comprising:
a phase adjustment circuit for adjusting respective phases of the word clock and a bit clock such that the word clock and the bit clock are out of phase with each other by an amount that is proportional to a period of the word clock.

19. The data receiver according to claim 17, further comprising:
a cascode circuit for amplifying a voltage swing at the receiving end.

20. The data receiver according to claim 17, further comprising:
a termination resistor adjustment circuit for adjusting input impedance such that the input impedance matches the characteristic impedance of the transmission line for the multi-level logic signal.

21. A data transfer method for transferring a plurality of bits of data, the method comprising:
using a data transmission system for generating a multi-level logic serial data transmission by multiplexing a plurality of data bits and a word clock, the word clock transmission frequency being less than a transmission frequency of the plurality of data bits in the serial data transmission;

extracting the plurality of data bits and the word clock from the serial data transmission;

wherein the multi-level logic signal defines the word clock and a plurality of digital data words in a single serial data transmission, and wherein a magnitude of the serial data transmission defines a state of the word clock and a plurality of signal levels define digital data within the serial data transmission corresponding to data defined by a plurality of parallel data bits; and further wherein a highest possible signal level of the serial data transmission indicates a high level for the word clock signal and a lowest possible signal level of the serial data transmission indicates a low level for the word clock, the plurality of levels of the serial data transmission having signal levels between the highest possible signal level and the lowest possible signal level defining digital data, at least some of the signal levels defining digital data having a value that is less than a signal level that is midway between the highest possible and lowest possible signal levels of the serial data transmission; and wherein the signal levels of the serial data transmission are demultiplexed into a separate clock output signal and plural individual data bit values for each clock output signal.

22. A data transmission method for transmitting a plurality of bits of data through a transmission line, the method comprising:

using a data transmission system for generating a multi-level logic signal representing a plurality of data bits of information in one symbol to transmit the generated signal, the information being obtained by combining a word clock and the serial data, wherein the multi-level logic signal defines a word clock and a plurality of digital data words in a single serial data transmission, the word clock transmission frequency being less than a transmission frequency of the plurality of data bits in the serial data transmission, and wherein a magnitude of the serial data transmission defines a state of the word clock and a plurality of signal levels define digital data within the serial data transmission corresponding to data defined by a plurality of parallel data bits; and further wherein a highest possible signal level of the serial data transmission indicates a high level for the word clock signal and a lowest possible signal level of the serial data transmission indicates a low level for the word clock, the plurality of levels of the serial data transmission having signal levels between the highest possible signal level and the lowest possible signal level defining digital data, at least some of the signal levels defining digital data having a value that is less than a signal level that is midway between the highest possible and lowest possible signal levels of the serial data transmission; and wherein the signal levels of the serial data transmission are demultiplexed into a separate clock output signal and plural individual data bit values for each clock output signal.

23. The data reception method of claim 22, further comprising receiving the multi-level logic signal and comparing the multi-level logic signal with reference voltages to extract serial data and the word clock and generating at least one further clock based on the extracted word clock that is used in further processing of the received data.

24. A data reception method for receiving a plurality of bits of data through a single transmission line, the method comprising the steps of:

receiving a multi-level serial data transmission representing a plurality of data bits of information and a word clock in a single serial data transmission, the word clock transmission frequency being less than a transmission frequency of the plurality of data bits in the serial data transmission;

comparing the multi-level logic signal with reference voltages to extract serial data and the word clock; and wherein a magnitude of the serial data transmission defines a state of the word clock and a plurality of signal levels define digital data within the serial data transmission; and further wherein a highest possible signal level of the serial data transmission indicates a high level for the word clock signal and a lowest possible signal level of the serial data transmission indicates a low level for the word clock, the plurality of levels of the serial data transmission having signal levels between the highest possible signal level and the lowest possible signal level defining digital data, at least some of the signal levels defining digital data having a value that is less than a signal level that is midway between the highest possible and lowest possible signal levels of the serial data transmission; and wherein the signal levels of the serial data transmission are demultiplexed into a separate clock output signal and plural individual data bit values for each clock output signal.

25. The data reception method of claim 24, comprising generating at least one further clock based on the extracted word clock that is used in further processing of the received data.

26. A data transfer system for transferring a plurality of bits of data, the system comprising:

a data transmitter means for generating a serial data transmission, the serial data transmission including information defining a plurality of data bits and a word clock, the word clock transmission frequency being less than a transmission frequency of the plurality of data bits in the serial data transmission, wherein a magnitude of the serial data transmission defines a state of the word clock and a plurality of levels of the serial logic signal define digital data within the serial data transmission corresponding to the data defined by the plurality of data bits; and further wherein a highest possible signal level of the serial data transmission indicates a high level for the word clock signal and a lowest possible signal level of the serial data transmission indicates a low level for the word clock, the plurality of levels of the serial data transmission having signal levels between the highest possible signal level and the lowest possible signal level defining digital data, at least some of the signal levels defining digital data having a value that is less than a signal level that is midway between the highest possible and lowest possible signal levels of the serial data transmission; and wherein the system demultiplexes the signal levels of the serial data transmission into a separate clock output signal and plural individual data bit values for each clock output signal.

* * * * *